United States Patent
Kato et al.

(10) Patent No.: US 10,374,150 B2
(45) Date of Patent: Aug. 6, 2019

(54) MAGNETIC MEMORY DEVICE

(71) Applicant: Kabushiki Kaisha Toshiba, Minato-ku (JP)

(72) Inventors: Yushi Kato, Chofu (JP); Yoshiaki Saito, Kawasaki (JP); Soichi Oikawa, Hachioji (JP); Mizue Ishikawa, Yokohama (JP); Hiroaki Yoda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,271

(22) Filed: Feb. 26, 2018

(65) Prior Publication Data

US 2018/0366639 A1 Dec. 20, 2018

(30) Foreign Application Priority Data

Jun. 16, 2017 (JP) ................................ 2017-118780

(51) Int. Cl.
*G11C 11/00* (2006.01)
*H01L 43/08* (2006.01)
(Continued)

(52) U.S. Cl.
CPC ............ *H01L 43/08* (2013.01); *G11C 11/161* (2013.01); *G11C 11/1675* (2013.01);
(Continued)

(58) Field of Classification Search
CPC ....... H01L 43/08; H01L 27/228; H01L 43/10; G11C 11/161; G11C 11/1673
See application file for complete search history.

(56) References Cited

U.S. PATENT DOCUMENTS 9,218,864 B1 * 12/2015 Yi .......................... G11C 11/161
9,240,799 B1 *  1/2016 Wang ..................... H03M 1/142
(Continued)

FOREIGN PATENT DOCUMENTS

JP          2010-238769          10/2010
JP             5985728            9/2016
(Continued)

OTHER PUBLICATIONS

P.V. Ong, et al. "Electric-field-driven magnetization switching and nonlinear magnetoelasticity in Au/FeCo/MgO heterostructures", Scientific Reports, 6, 2016, 8 pages.
(Continued)

*Primary Examiner* — Toan K Le
(74) *Attorney, Agent, or Firm* — Oblon, McClelland, Maier & Neustadt, L.L.P.

(57) ABSTRACT

According to one embodiment, a magnetic memory device includes a conductive layer, first and second magnetic layers, a first nonmagnetic layer and a controller. The conductive layer includes first and second portions, and a third portion positioned between the first and second portions. The conductive layer includes a first metal. The first magnetic layer is separated from the third portion. The second magnetic layer is provided between the third portion and the first magnetic layer. The first nonmagnetic layer is provided between the first and second magnetic layers. The controller is electrically connected to the first and second portions. The second magnetic layer has first and second lattice lengths. The first lattice length is longer than the second lattice length. The controller implements a first operation of supplying a first current to the conductive layer, and a second operation of supplying a second current to the conductive layer.

20 Claims, 17 Drawing Sheets

(51) Int. Cl.
    G11C 11/16    (2006.01)
    H01L 27/22    (2006.01)
    H01L 43/10    (2006.01)
(52) U.S. Cl.
    CPC ............ *H01L 27/228* (2013.01); *H01L 43/10*
            (2013.01); *G11C 11/1673* (2013.01)

(56) References Cited

U.S. PATENT DOCUMENTS

| | | | |
|---|---|---|---|
| 2010/0244163 A1 | 9/2010 | Daibou et al. | |
| 2016/0247550 A1 | 8/2016 | Fukami et al. | |
| 2017/0069365 A1* | 3/2017 | Buhrman | G11C 11/18 |
| 2017/0076769 A1 | 3/2017 | Shirotori et al. | |
| 2017/0076770 A1 | 3/2017 | Daibou et al. | |
| 2017/0169872 A1* | 6/2017 | Yoda | G11C 11/1675 |
| 2017/0178705 A1* | 6/2017 | Buhrman | H01L 43/08 |
| 2018/0040357 A1* | 2/2018 | Shirotori | G11C 11/161 |
| 2018/0040812 A1* | 2/2018 | Shimizu | G11C 11/161 |
| 2018/0174634 A1 | 6/2018 | Kato et al. | |

FOREIGN PATENT DOCUMENTS

| | | |
|---|---|---|
| JP | 2017-59594 | 3/2017 |
| JP | 2018-98432 A | 6/2018 |
| WO | WO 2015/068509 | 3/2017 |

OTHER PUBLICATIONS

P.V. Ong, et al. "Giant voltage modulation of magnetic anisotropy in strained heavy metal/magnet/insulator heterostructures", Physical Review B 92, 2015, 5 pages.

Arti Kashyap, et al. "Voltage Controlled Magnetism", MMM2017, FF-02, 2017, 2 pages.

R. People, et al. "Calculation of critical layer thickness versus lattice mismatch for $Ge_xSi_{1-x}$/Si strained-layer heterostructures", Appl. Phys. Lett., 47, 1985, 4 pages.

* cited by examiner

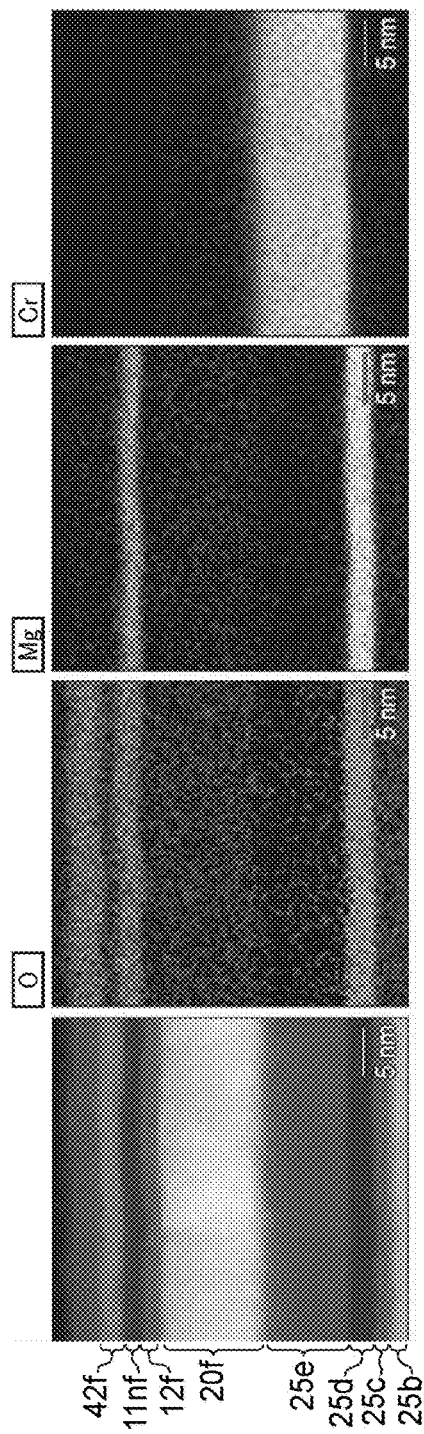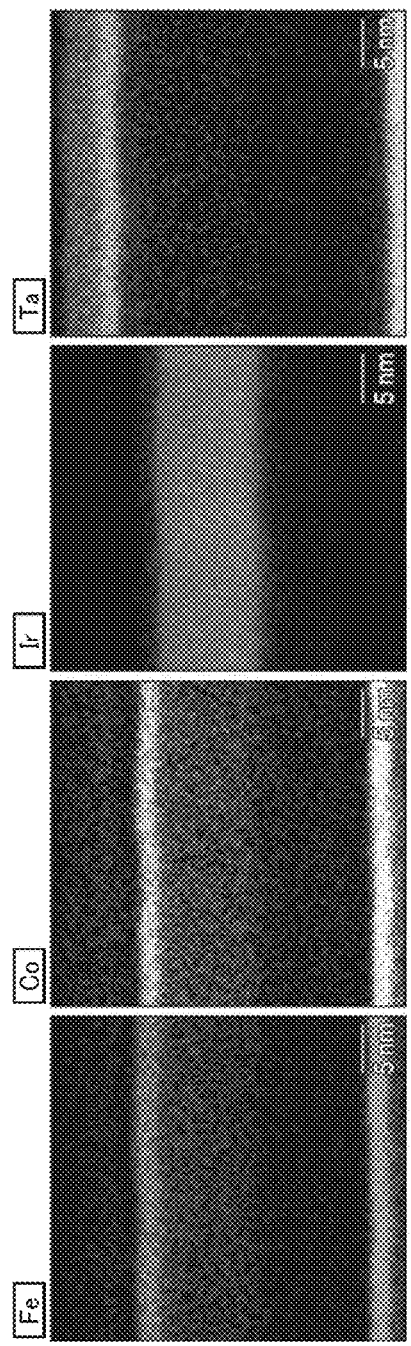

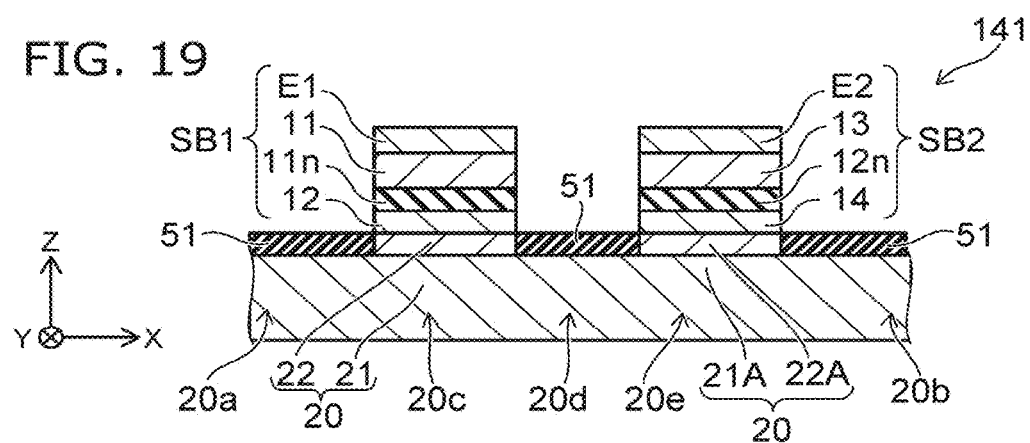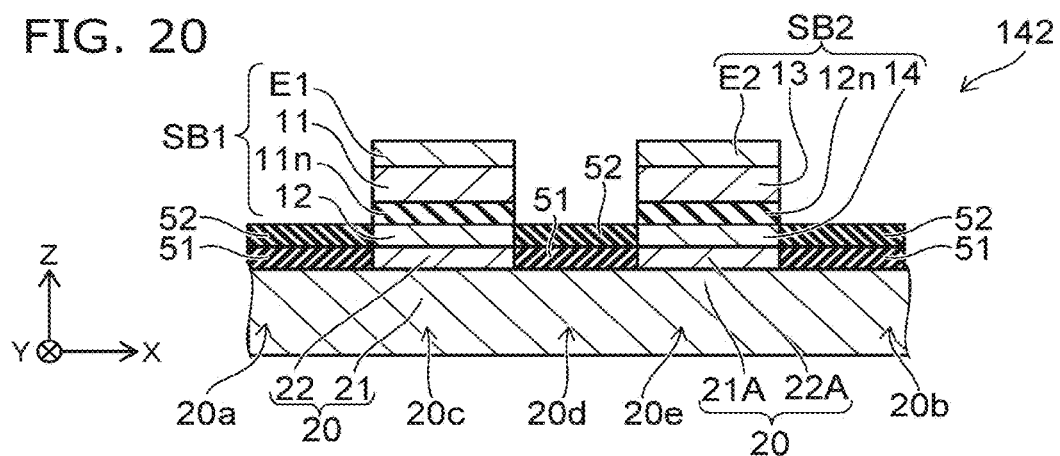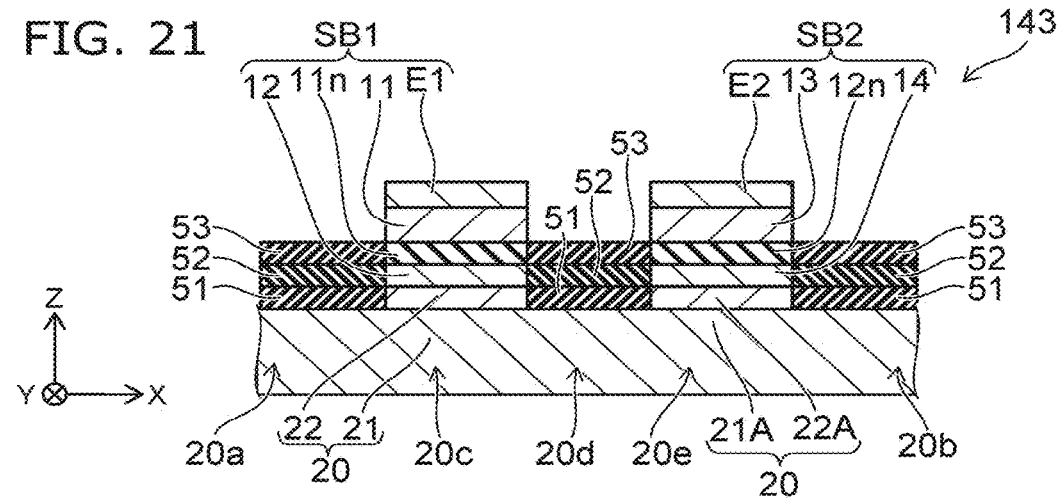

MAGNETIC MEMORY DEVICE

CROSS-REFERENCE TO RELATED APPLICATIONS

This application is based upon and claims the benefit of priority from Japanese Patent Application No. 2017-118780, filed on Jun. 16, 2017; the entire contents of which are incorporated herein by reference.

FIELD

Embodiments described herein relate generally to a magnetic memory device.

BACKGROUND

There is a magnetic memory device that uses a magnetic layer. Stable operations of the magnetic memory device are desirable.

BRIEF DESCRIPTION OF THE DRAWINGS

FIG. 12A to FIG. 12H are microscope photographs illustrating the magnetic memory device;

FIG. 19 is a schematic cross section illustrating a magnetic memory device according to a third embodiment;

FIG. 20 is a schematic cross section illustrating another magnetic memory device according to the third embodiment;

FIG. 21 is a schematic cross section illustrating another magnetic memory device according to the third embodiment;

DETAILED DESCRIPTION

Figure 1A:
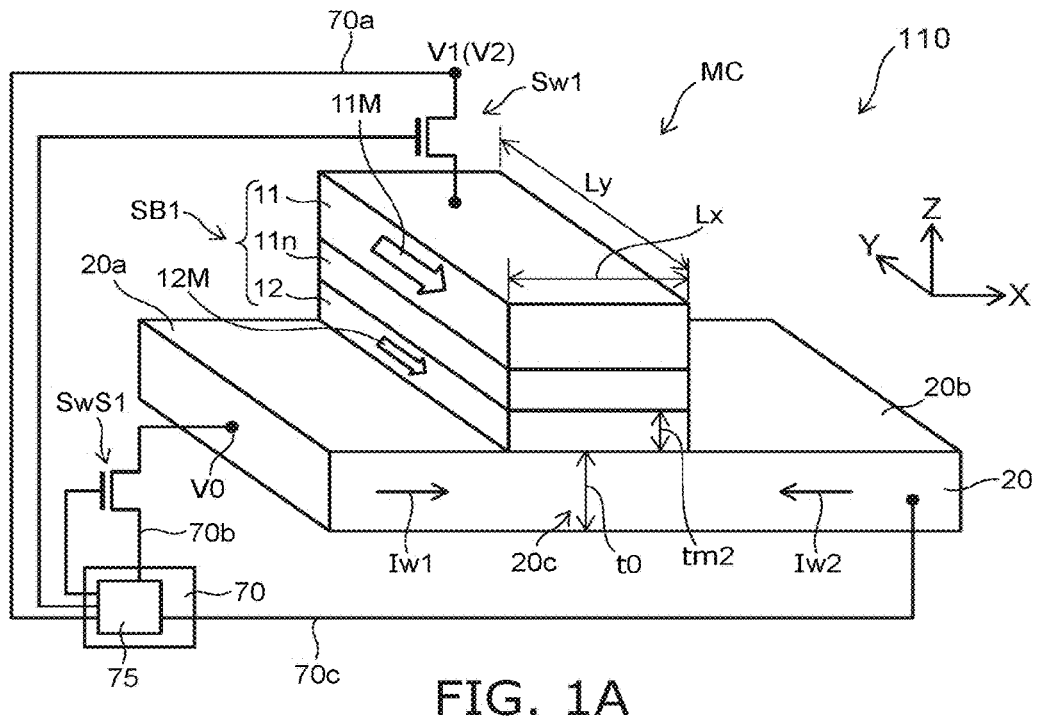
FIG. 1A and FIG. 1B are schematic perspective views illustrating a magnetic memory device according to a first embodiment.

According to one embodiment, a magnetic memory device includes a conductive layer, a first magnetic layer, a second magnetic layer, a first nonmagnetic layer and a controller. The conductive layer includes a first portion, a second portion, and a third portion positioned between the first portion and the second portion. The conductive layer includes a first metal. The first magnetic layer is separated from the third portion in a first direction crossing a second direction. The second direction is from the first portion toward the second portion. The second magnetic layer is provided between the third portion and the first magnetic layer. The first nonmagnetic layer is provided between the first magnetic layer and the second magnetic layer. The controller is electrically connected to the first portion and the second portion. The second magnetic layer has a first lattice length and a second lattice length. The first lattice length is along the first direction. The second lattice length is along a direction perpendicular to the first direction. The first lattice length is longer than the second lattice length. The controller implements a first operation of supplying a first current to the conductive layer from the first portion toward the second portion, and a second operation of supplying a second current to the conductive layer from the second portion toward the first portion.

According to another embodiment, a magnetic memory device includes a conductive layer, a first magnetic layer, a second magnetic layer, a first nonmagnetic layer, and a controller. The conductive layer includes a first portion, a second portion, and a third portion positioned between the first portion and the second portion. The first magnetic layer is separated from the third portion in a first direction crossing a second direction. The second direction is from the first portion toward the second portion. The second magnetic layer is provided between the third portion and the first magnetic layer. The first nonmagnetic layer is provided between the first magnetic layer and the second magnetic layer. The controller is electrically connected to the first portion and the second portion. The third portion includes a first region and a second region. The first region includes a first metal. The second region includes the first metal and boron and is provided between the first region and the second magnetic layer. The first region does not include boron, or a first concentration of boron in the first region is lower than a second concentration of boron in the second region. The second magnetic layer has a first lattice length and a second lattice length. The first lattice length is along the first direction. The second lattice length is along a direction perpendicular to the first direction. The first lattice length is longer than the second lattice length. The controller implements a first operation of supplying a first current to the conductive layer from the first portion toward the second portion, and a second operation of supplying a second current to the conductive layer from the second portion toward the first portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
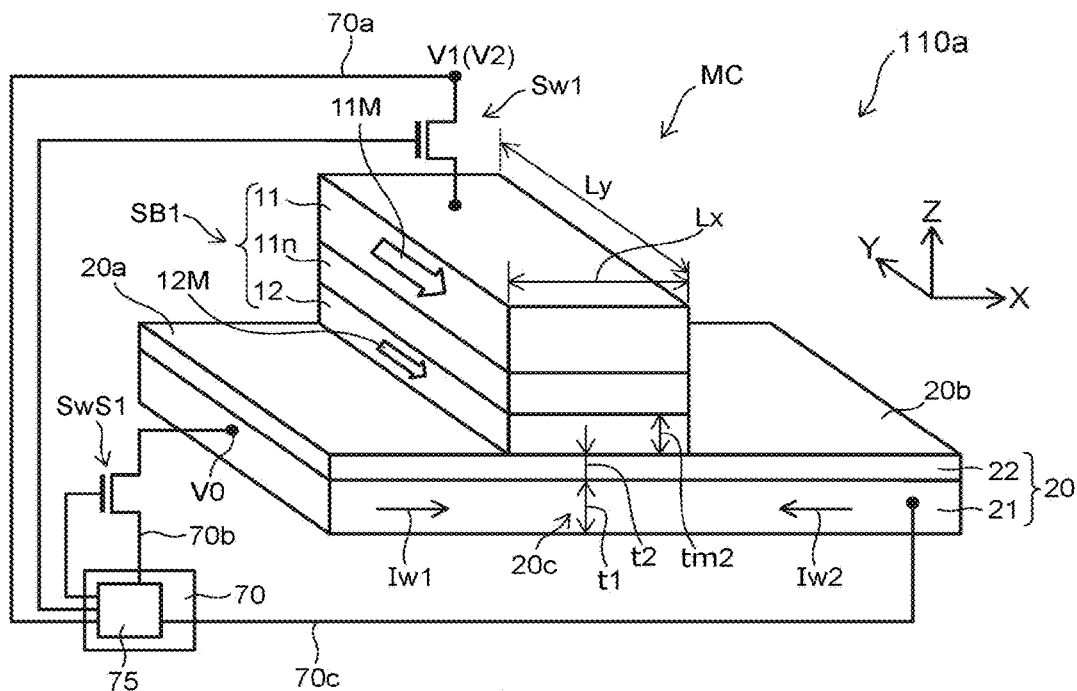

FIG. 1A and FIG. 1B are schematic perspective views illustrating a magnetic memory device according to a first embodiment.

As shown in FIG. 1A, the magnetic memory device 110 according to the embodiment includes a conductive layer 20, a first magnetic layer 11, a second magnetic layer 12, a first nonmagnetic layer 11n, and a controller 70.

The conductive layer 20 includes a first portion 20a, a second portion 20b, and a third portion 20c. The third portion 20c is positioned between the first portion 20a and the second portion 20b.

The conductive layer 20 includes a first metal. The first metal includes at least one selected from the group consisting of Rh, Pd, and Ir. The first metal may further include Ru in addition to the at least one selected from the group consisting of Rh, Pd, and Ir.

The first magnetic layer 11 is separated from the third portion 20c in the first direction. The first direction crosses a direction (a second direction) from the first portion 20a toward the second portion 20b.

A first direction is taken as a Z-axis direction. One direction perpendicular to the Z-axis direction is taken as an X-axis direction. A direction perpendicular to the Z-axis direction and the X-axis direction is taken as a Y-axis direction. In the example, the second direction is the X-axis direction.

The second magnetic layer 12 is provided between the third portion 20c and the first magnetic layer 11. The first nonmagnetic layer 11n is provided between the first magnetic layer 11 and the second magnetic layer 12. Another layer may be provided between the first nonmagnetic layer 11n and the first magnetic layer 11. Another layer may be provided between the first nonmagnetic layer 11n and the second magnetic layer 12.

The first magnetic layer 11 functions as, for example, a reference layer. The second magnetic layer 12 functions as, for example, a memory layer (e.g., a free layer). A second magnetization 12M of the second magnetic layer 12 changes more easily than a first magnetization 11M of the first magnetic layer 11. The orientation of the second magnetization 12M of the second magnetic layer 12 corresponds to information to be stored. The orientation of the magnetization corresponds to, for example, the orientation of the easy magnetization axis.

The first magnetic layer 11, the first nonmagnetic layer 11n, and the second magnetic layer 12 are included in a first stacked body SB1. The first stacked body SB1 functions as, for example, at least a portion of one memory cell MC. The first stacked body SB1 has a magnetic tunnel junction (Magnetic Tunnel Junction (MTJ)). The first stacked body SB1 corresponds to a MTJ element.

In the example, the easy magnetization axis of the second magnetic layer 12 crosses the first direction (e.g., the Z-axis direction). The second magnetic layer 12 is an in-plane magnetization film.

In the example, a length Ly along a third direction of the first magnetic layer 11 is longer than a length Lx along the second direction of the first magnetic layer 11. The third direction crosses a plane including the first direction and the second direction. The third direction is, for example, the Y-axis direction. Shape anisotropy occurs in the first magnetic layer 11 and the second magnetic layer 12. For example, the first magnetization 11M of the first magnetic layer 11 is aligned with the Y-axis direction. For example, the second magnetization 12M of the second magnetic layer 12 is oriented in the +Y direction or the −Y direction. As described below, in the other examples of the embodiment, the relationship between the length Ly and the length Lx is arbitrary. In the embodiment, the orientations of the magnetizations are arbitrary.

The controller 70 is electrically connected to the first portion 20a and the second portion 20b. In the example, the controller 70 includes a control circuit 75. The control circuit 75 (the controller 70) and the first portion 20a are electrically connected by an interconnect 70b. The control circuit 75 (the controller 70) and the second portion 20b are electrically connected by an interconnect 70c. In the example, a switch SwS1 is provided in a current path (the interconnect 70b) between the control circuit 75 and the first portion 20a. The gate (the control terminal) of the switch SwS1 is electrically connected to the control circuit 75.

In the example, the control circuit 75 (the controller 70) is electrically connected to the first magnetic layer 11. The control circuit 75 (the controller 70) and the first magnetic layer 11 are electrically connected by an interconnect 70a. In the example, a switch Sw1 is provided in a current path (the interconnect 70a) between the control circuit 75 and the first magnetic layer 11. The gate (the control terminal) of the switch Sw1 is electrically connected to the control circuit 75.

These switches may be included in the controller 70. The potentials of the conductive layer 20 and the first stacked body SB1 are controlled by the controller 70.

For example, the first portion 20a is set to a reference potential V0; and a first voltage V1 (e.g., a select voltage) is applied to the first magnetic layer 11. At this time, for example, the electrical resistance of the first stacked body SB1 changes according to the orientation of the current flowing in the conductive layer 20. On the other hand, the first portion 20a is set to the reference potential V0; and a second voltage V2 (e.g., an unselect voltage) is applied to the first magnetic layer 11. The second voltage V2 is different from the first voltage V1. When the second voltage V2 is applied, for example, the electrical resistance of the first stacked body SB1 substantially does not change even when a current flows in the conductive layer 20. The change of the electrical resistance corresponds to the change of the state of the first stacked body SB1. The change of the electrical resistance corresponds to, for example, the change of the orientation of the second magnetization 12M of the second magnetic layer 12. For example, the second voltage V2 is different from the first voltage V1. For example, the absolute value of the potential difference between the reference potential V0 and the first voltage V1 is greater than the absolute value of the potential difference between the reference potential V0 and the second voltage V2. For example, the polarity of the first voltage V1 may be different from the polarity of the second voltage V2. Such an electrical resistance difference is obtained by the control of the controller 70.

For example, the controller 70 performs a first operation and a second operation. These operations are operations when the select voltage is applied to the stacked body SB1. In the first operation, the controller 70 supplies a first current Iw1 to the conductive layer 20 from the first portion 20a toward the second portion 20b (referring to FIG. 1A). In the second operation, the controller 70 supplies a second current Iw2 to the conductive layer 20 from the second portion 20b toward the first portion 20a (referring to FIG. 1A).

A first electrical resistance between the first magnetic layer 11 and the first portion 20a after the first operation is different from a second electrical resistance between the first magnetic layer 11 and the first portion 20a after the second operation. Such an electrical resistance difference corresponds to, for example, the change of the orientation of the second magnetization 12M of the second magnetic layer 12. For example, the orientation of the second magnetization 12M changes due to the current (a write current) flowing through the conductive layer 20. For example, it is considered that this is based on the spin Hall effect. For example, it is considered that the change of the orientation of the second magnetization 12M is based on spin-orbit coupling.

For example, the second magnetization 12M is caused by the first operation to have a component having the same orientation as the first magnetization 11M. A "parallel" magnetization is obtained. On the other hand, the second magnetization 12M is caused by the second operation to have a component having the reverse orientation of the first magnetization 11M. An "antiparallel" magnetization is obtained. In such a case, the first electrical resistance after the first operation is lower than the second electrical resistance after the second operation. Such an electrical resistance difference corresponds to the information to be stored. For example, multiple different magnetizations correspond to the information to be stored.

The controller 70 may further implement a third operation and a fourth operation. In the third operation, the potential difference between the first portion 20a and the first magnetic layer 11 is set to the second voltage V2; and the first current Iw1 is supplied to the conductive layer 20. In the fourth operation, the potential difference between the first portion 20a and the first magnetic layer 11 is set to the second voltage V2; and the second current Iw2 is supplied to the conductive layer 20. In the third operation and the fourth operation, for example, the electrical resistance of the first stacked body SB1 substantially does not change even when a current flows in the conductive layer 20. The first electrical resistance between the first magnetic layer 11 and the first portion 20a after the first operation is different from the second electrical resistance between the first magnetic layer 11 and the first portion 20a after the second operation. The absolute value of the difference between the first electrical resistance and the second electrical resistance is greater than the absolute value of the difference between the third electrical resistance between the first magnetic layer 11 and the first portion 20a after the third operation and the fourth electrical resistance between the first magnetic layer 11 and the first portion 20a after the fourth operation.

The second magnetic layer 12 includes at least one selected from the group consisting of Co and Fe. For example, the second magnetic layer 12 includes, for example, $Co_{x1}Fe_{1-x1}$ ($0 \leq x1 \leq 0.6$). The second magnetic layer 12 may further include boron (B).

As described above, the conductive layer 20 includes the first metal (at least one selected from the group consisting of Rh, Pd, and Ir). The lattice constant of the first metal is smaller than the lattice constant of the CoFe or the like included in the second magnetic layer 12. For example, distortion (crystal distortion) occurs in the lattice of the second magnetic layer 12 due to the difference of the lattice constants (the lattice mismatch). The distortion (the crystal distortion) of the lattice is described below.

In the embodiment, a thickness t0 (the length along the first direction (the Z-axis direction)) of the conductive layer 20 is, for example, not less than 2 nanometers (nm) and not more than 11 nm. On the other hand, a thickness tm2 (the length along the first direction (the Z-axis direction)) of the second magnetic layer 12 is not less than 0.5 nanometers and not more than 3 nanometers. The lattice mismatch occurs effectively when these layers are in the appropriate range. The lattice relaxes easily if the thicknesses are excessively thick.

In the embodiment, at least a portion of the conductive layer 20 may include boron.

In a magnetic memory device 110a as shown in FIG. 1B, the conductive layer 20 includes a first region 21 and a second region 22. The second region 22 is provided between the first region 21 and the second magnetic layer 12. For example, the second region 22 physically contacts the second magnetic layer 12. The second region 22 includes the first metal and boron.

As described below, such a second region 22 may be provided in a portion (the third portion 20c) of the conductive layer 20. For example, the second region 22 may be provided locally in a portion (the third portion 20c) including a region overlapping the first stacked body SB1 in the Z-axis direction.

In the example, the first region 21 extends along the second direction (e.g., the X-axis direction) between the first portion 20a and the second portion 20b. The second region 22 extends along the second direction between the first portion 20a and the second portion 20b.

The second region 22 includes boron and at least one selected from the group consisting of Rh, Pd, and Ir. The second region 22 includes, for example, at least one selected from the group consisting of RhB, PdB, and IrB. The second region 22 may include, for example, at least one selected from the group consisting of RuIrB and RuRhB.

On the other hand, the first region 21 does not include boron. Or, the first region 21 includes boron; and the first concentration of boron in the first region is lower than the second concentration of boron in the second region 22. The first region 21 includes, for example, at least one selected from the group consisting of Rh, Pd, and Ir. The first region 21 may include, for example, Ru and at least one selected from the group consisting of Rh, Pd, and Ir.

As described below, a large spin Hall effect is obtained by providing such a first region 21 and such a second region 22 in the conductive layer 20.

In the embodiment, a first thickness t1 along the first direction of the first region 21 is, for example, not less than 1 nanometer and not more than 10 nanometers. A second thickness t2 along the first direction of the second region 22 is, for example, not less than 1 nanometer and not more than 10 nanometers. The sum of the first thickness t1 and the second thickness t2 corresponds to the thickness t0 (referring to FIG. 1A).

In the embodiment, distortion (crystal distortion) occurs in the lattice of the second magnetic layer 12. Examples of the distortion will now be described.

Figure 2A:
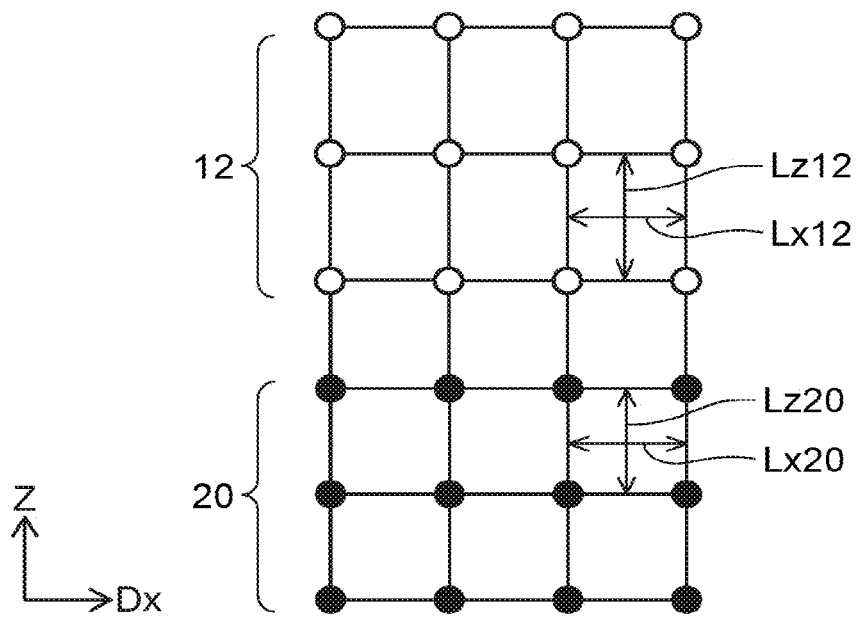
FIG. 2A to FIG. 2C are schematic views illustrating the magnetic memory device according to the first embodiment.
Figure 2B:
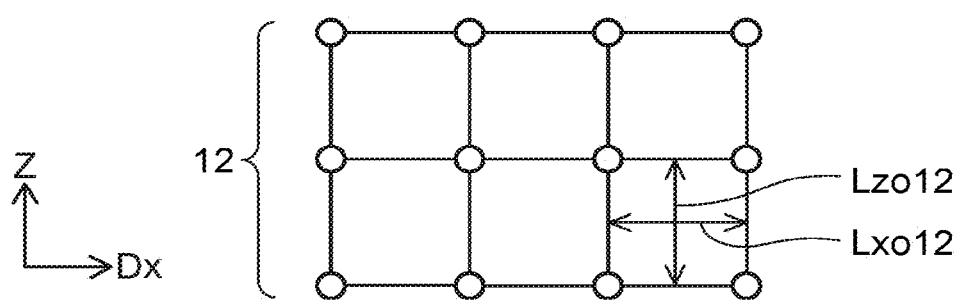
Figure 2C:
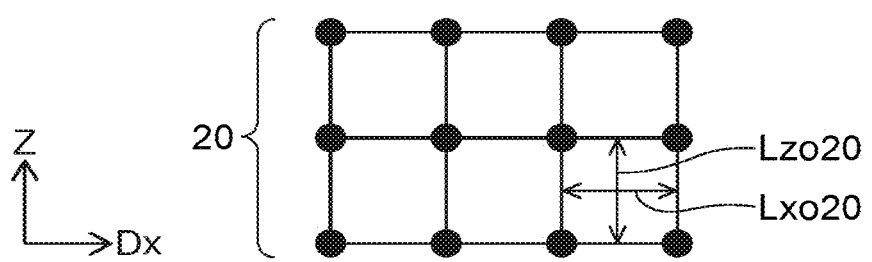

FIG. 2A to FIG. 2C are schematic views illustrating the magnetic memory device according to the first embodiment.

These drawings schematically show the states of the lattices of the second magnetic layer 12 and the conductive layer 20.

As shown in FIG. 2A, the lattices of the second magnetic layer 12 and the conductive layer 20 are aligned with the first direction (the Z-axis direction). For example, the <001> direction of the conductive layer 20 is aligned with the first direction. For example, the <001> direction of the second magnetic layer 12 is aligned with the first direction. For example, the (001) plane of the conductive layer 20 is aligned with a plane perpendicular to the first direction. For example, the (001) plane of the second magnetic layer 12 is aligned with a plane perpendicular to the first direction.

The second magnetic layer 12 has a first lattice length Lz12 and a second lattice length Lx12. The first lattice length Lz12 is the lattice length along the first direction (the Z-axis direction). The second lattice length Lx12 is the lattice length along a direction Dx perpendicular to the first direction. Thus, a lattice length difference occurs. In other words, distortion (crystal distortion) occurs in the lattice of the second magnetic layer 12.

The distortion of the lattice is caused by the difference of the lattice constants between the second magnetic layer 12 and the conductive layer 20. Also, the lattices are continuous in the two layers having the different lattice constants (referring to FIG. 2A). The distortion of the lattice is generated because the lattices are continuous. For example, a pseudomorphism (pseudomorphic) occurs in the second magnetic layer 12 and the conductive layer 20.

FIG. 2B illustrates the state of the undistorted lattice of the second magnetic layer 12. A lattice length Lzo12 along the first direction (the Z-axis direction) is substantially the same as a lattice length Lxo12 along the direction Dx.

FIG. 2C illustrates the state of the undistorted lattice of the conductive layer 20. A lattice length Lzo20 along the first direction (the Z-axis direction) is substantially the same as a lattice length Lxo20 along the direction Dx.

The lattice length Lxo12 is longer than the lattice length Lxo20. In other words, the lattice constant of the second magnetic layer 12 along the direction Dx perpendicular to the first direction (the Z-axis direction) is larger than the lattice constant of the conductive layer 20 along the direction Dx. When the lattices of such two layers are continuous, the distortion of the lattice occurs based on the difference of the lattice lengths (the lattice constants) (referring to FIG. 2A).

There are cases where, for example, at least a portion of the second magnetic layer 12 has a BCT (body-centered tetragonal) structure. There are cases where, for example, at least a portion of the second magnetic layer 12 has a FCT (face-centered tetragonal) structure. The second magnetic layer 12 may include, for example, a region having a BCT structure, and a region having a FCT structure.

It was found that a large voltage effect (or electric field effect) is obtained in such a configuration. For example, there are cases where the magnetic properties of a magnetic layer change according to the voltage (or the electric field) applied to the magnetic layer. The ratio of the change of the magnetic property to the change of the applied voltage (or electric field) corresponds to the voltage effect.

Experimental results of the voltage effects will now be described.

Figure 3:
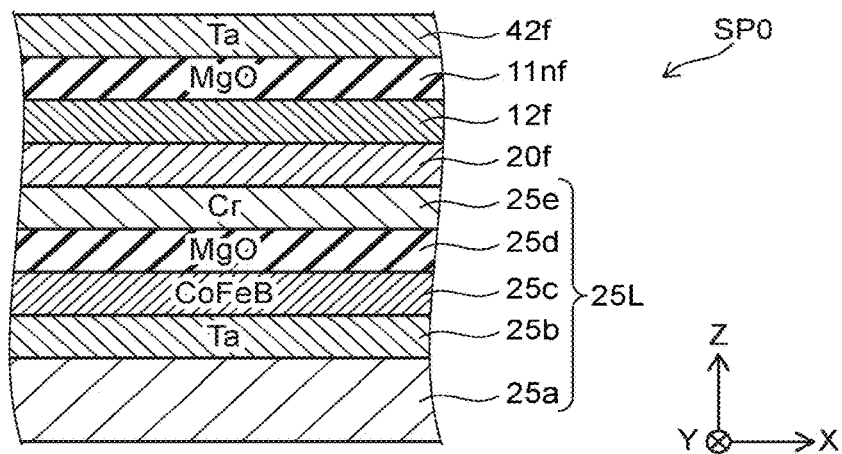
FIG. 3 is a schematic cross-sectional view showing an experiment sample.

FIG. 3 is a schematic cross-sectional view showing an experiment sample.

In a sample SP0 as shown in FIG. 3, a Ta film 25b (having a thickness of 3 nm) is provided on a substrate 25a. A CoFeB film 25c (having a thickness of 2 nm) is provided on the Ta film 25b. A MgO film 25d (having a thickness of 3 nm) is provided on the CoFeB film 25c. A Cr film 25e (having a thickness of 10 nm) is provided on the MgO film 25d. A conductive film 20f is provided on the Cr film 25e. In this sample, the conductive film 20f is an Ir film having a thickness of 10 nm. A second magnetic film 12f is provided on the conductive film 20f. In this sample, the second magnetic film 12f is a $Co_{50}Fe_{50}$ film having a thickness of 2 nm. A first nonmagnetic film 11nf is provided on the second magnetic film 12f. In this sample, the first nonmagnetic film 11nf is a MgO film having a thickness of 3 nm. A Ta film 42f (having a thickness of 3 nm) is provided on the first nonmagnetic film 11nf. The substrate 25a is a silicon substrate including a thermal oxide film. The silicon substrate includes a silicon base body, and a silicon oxide region (the thermal oxide film) provided on the silicon base body. The orientation of the upper surface of the MgO film 25d is (001). The substrate 25a, the Ta film 25b, the CoFeB film 25c, the MgO film 25d, and the Cr film 25e are included in a lower layer 25L.

The film formation is performed by sputtering at room temperature (about 25° C.). After the film formation, heat treatment is performed for 1 hour at 300° C. After the heat treatment, a stacked film that includes each of the films recited above is patterned. After the patterning, the length in one direction (e.g., the X-axis direction) of the stacked film is about 10 µm; and the length in another direction (e.g., the Y-axis direction) is about 10 µm.

For the sample SP0, the magnetic properties of the sample SP0 are measured in the state in which a voltage is applied between the conduction film 20f and the Ta film 42f. An effective perpendicular magnetic anisotropy field Hk_eff (or an effective perpendicular anisotropic magnetic field) and an interface magnetic anisotropy energy Es are derived from the magnetic properties.

Figure 4A:
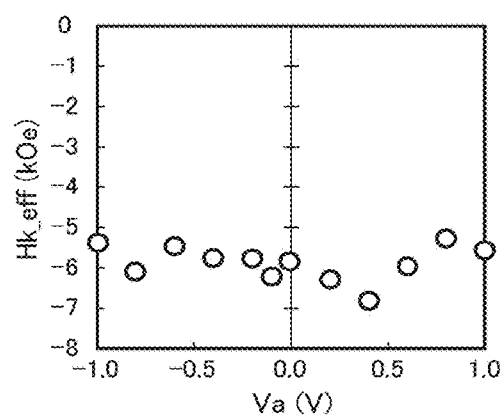
FIG. 4A and FIG. 4B are graphs showing the experimental results.
Figure 4B:
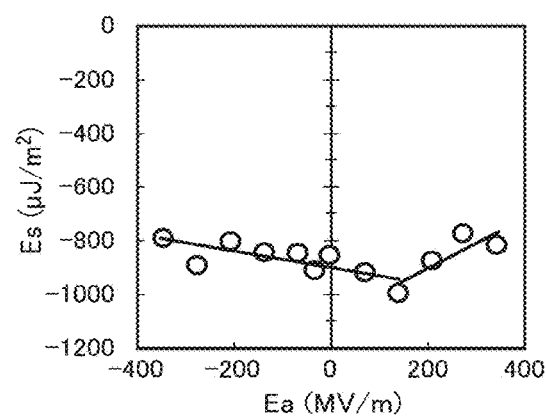

FIG. 4A and FIG. 4B are graphs showing the experimental results.

The horizontal axis of FIG. 4A is an applied voltage Va (V). The vertical axis is the effective perpendicular magnetic anisotropy field Hk_eff. The horizontal axis of FIG. 4B is an applied electric field Ea (MV/m) that corresponds to the applied voltage Va. The vertical axis is the interface magnetic anisotropy energy Es ($\mu J/m^2$). The interface magnetic anisotropy energy Es corresponds to the product of the effective thickness of the magnetic layer and the effective perpendicular magnetic anisotropy energy.

As shown in FIG. 4A, the behavior of the change of the effective perpendicular magnetic anisotropy field Hk_eff with respect to the change of the applied voltage Va is different according to the applied voltage Va. For example, the slope of the change of the effective perpendicular magnetic anisotropy field Hk_eff with respect to the change of the applied voltage Va is negative in the region where the applied voltage Va is less than 0.4 V. The slope of the change of the effective perpendicular magnetic anisotropy field Hk_eff with respect to the change of the applied voltage Va is positive in the region where the applied voltage Va is 0.4 V or more.

As shown in FIG. 4B, the behavior of the change of the interface magnetic anisotropy energy Es with respect to the change of the applied electric field Ea is different according to the applied electric field Ea. For example, the slope of the change of the interface magnetic anisotropy energy Es with respect to the change of the applied electric field Ea is negative in the region where the applied electric field Ea is less than 150 MV/m. The slope of the change of the interface magnetic anisotropy energy Es with respect to the change of the applied electric field Ea is positive in the region where the applied electric field Ea is 150 MV/m or more.

Ranges of the applied voltage Va exist where the degree (the change rate) of the change of the effective perpendicular magnetic anisotropy field Hk_eff with respect to the change of the applied voltage Va is different. Ranges of the applied electric field Ea exist where the degree (the change rate) of the change of the interface magnetic anisotropy energy Es with respect to the applied electric field Ea is different. In the example, a region where the change rate is positive (a region where the slope of the change is positive) and a region where the change rate is negative (a region where the slope of the change is negative) exist. The voltage effect is observed.

As illustrated in these drawings, the magnitude of the voltage effect is about 1000 fJ/Vm. This value is extremely large compared to the values of the voltage effect reported up to now. In the example shown in FIG. 4A and FIG. 4B, the applied voltage Va where the positive or negative of the change rate changes is about 0.4 V. For example, this value changes according to the distortion of the second magnetic layer 12.

It is considered that the voltage effect observed for the sample SP0 is because the distortion (the crystal distortion) is introduced to the crystal of the second magnetic film 12f (the CoFe film).

In the example, the degree of the change in the region where the voltage effect is positive is larger than the degree of the change in the region where the voltage effect is negative. It is considered that the behavior of the reverse of the positive or negative of the voltage effect (the slope) is because the band structure of the energy of the second magnetic layer 12 (the CoFe film) changes due to the applied voltage Va (the applied electric field Ea).

The second magnetic layer 12 (the CoFe film) that has a lattice continuous with the conductive layer 20 is provided on the conductive layer 20 (the Ir film); and it is considered that the distortion of the crystal lattice is generated in the second magnetic layer 12. It is considered that the band structure of the energy changes due to the applied voltage Va (or the applied electric field Ea) in the crystal having the distortion. It is considered that the large voltage effect is obtained thereby.

In the sample SP0, the second magnetic film 12f (i.e., the second magnetic layer 12) is a CoFe film (a $Co_{50}Fe_{50}$ film). There are cases where the second magnetic film 12f (the second magnetic layer 12) includes boron in addition to CoFe. Thereby, for example, there are cases where a better crystalline state is obtained in the first stacked body SB1. For example, there are cases where better magnetic properties are obtained. For example, there are cases where better interface flatness is obtained.

A large voltage effect is obtained even in the case where the second magnetic film 12f (the second magnetic layer 12) includes boron.

If the second magnetic film 12f (the second magnetic layer 12) includes boron, there are cases where the boron that is included in the second magnetic film 12f moves (diffuses) into a portion of the conductive layer 20. Inside the conductive layer 20, for example, the region that includes boron is on the second magnetic layer 12 side. If boron is included in the entire conductive layer 20, for example, there are cases where the lattice of the conductive layer 20 becomes unstable.

For example, the portion (the second region 22) of the conductive layer 20 on the second magnetic layer 12 side includes boron; and the portion (the first region 21) of the conductive layer 20 distal to the second magnetic layer 12 does not include boron, or has a low concentration of boron. A stable lattice is obtained in the first region 21 where the boron concentration is low. The thickness of the second region 22 including boron is set to be thin. Thereby, the stable lattice of the first region 21 is transferred efficiently to the second magnetic layer 12. Thereby, the distortion (the crystal distortion) of the lattice occurs in the second magnetic layer 12 based on the difference of the lattice constants between the first region 21 and the second magnetic layer 12. The change of the band structure is induced easily based on the difference of the lattices; and a large voltage effect such as that recited above occurs.

Thus, a large voltage effect is obtained in the embodiment. Thereby, the magnetization can be controlled stably. Thereby, stable operations are possible.

As described below, a large spin Hall effect (or large spin-orbit coupling) is obtained because the second region 22 (the portion on the second magnetic layer 12 side) of the conductive layer 20 includes boron. It is considered that this is because the scattering efficiency of the electrons increases because the second region 22 includes boron; and as a result, the spin Hall effect becomes large.

In one example, boron is included in the second region 22 due to movement (diffusion) from the second magnetic layer 12. In another example, a film that includes boron (a film that is used to form the second region 22) is formed on a film not including boron (a film used to form the first region 21). A large field effect and a large spin Hall effect are obtained in other examples.

Thus, a large spin Hall effect is obtained in the embodiment. Thereby, the magnetization can be controlled stably. Thereby, more stable operations are possible.

In the embodiment, the degree of the change in the region where the voltage effect is positive may be smaller than the degree of the change in the region where the voltage effect is negative. In the example recited above, the voltage effect characteristic is V-shaped. In the embodiment, for example, the voltage effect characteristic changes according to the distortion of the second magnetic layer 12. For example, the voltage effect characteristic may have, for example, a "vertically inverted V-shape."

Examples of the difference between lattice lengths of the conductive layer 20 and the second magnetic layer 12 will now be described.

Figure 5:
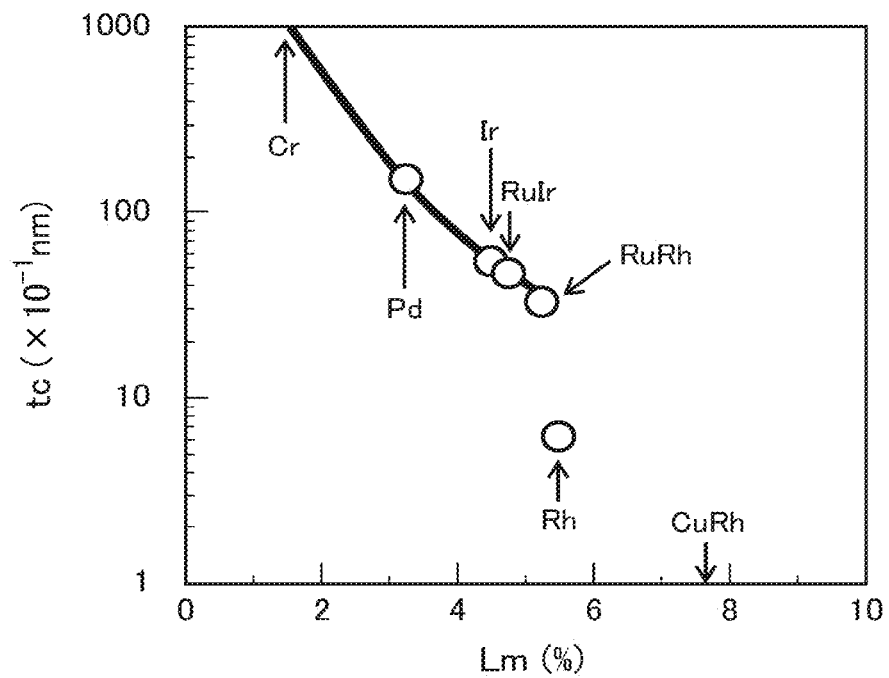
FIG. 5 is a graph illustrating characteristics of the magnetic memory device.

FIG. 5 is a graph illustrating characteristics of the magnetic memory device.

FIG. 5 illustrates the relationship between the type of the metal material and the critical thickness tc of the second magnetic layer 12. In the example, the second magnetic layer 12 is a $Co_{50}Fe_{50}$ film. The $Co_{50}Fe_{50}$ film is provided on layers (corresponding to the conductive layer 20) of different types of metal materials. In such a case, there is a difference between the lattice constants of these two layers. The lattice constant is, for example, the lattice length along the direction Dx perpendicular to the Z-axis direction (the first direction) when undistorted. When the thickness (the thickness tm2) of the $Co_{50}Fe_{50}$ film exceeds the critical thickness tc, dislocations occur; and the lattice relaxes. At this time, the lattice becomes discontinuous. Or, the lattice length of the $Co_{50}Fe_{50}$ film changes continuously toward the lattice constant (the lattice length along the direction Dx when undistorted) of the $Co_{50}Fe_{50}$ film. In the case where the thickness tm2 is not more than the critical thickness tc, the distortion that corresponds to the difference of the lattice constants is applied to the second magnetic layer 12 (the $Co_{50}Fe_{50}$ film) without the distortion relaxing.

The lattice constant (the lattice length in a direction aligned with the direction Dx) of the metal material (corresponding to the conductive layer 20) corresponds to the lattice length Lxo20 (referring to FIG. 2C). The lattice constant (the lattice length in a direction aligned with the direction Dx) of the $Co_{50}Fe_{50}$ film (corresponding to the second magnetic layer 12) corresponds to the lattice length Lxo12 (referring to FIG. 2B). The difference between the lattice length Lxo20 and the lattice length Lxo12 corresponds to the difference of the lattice constants. In the example, the lattice length Lxo12 is larger than the lattice length Lxo20.

The horizontal axis of FIG. 5 is an absolute value of a lattice mismatch Lm (%). The lattice mismatch Lm is the ratio of the difference between the lattice length Lxo12 and the lattice length Lxo20 to the lattice length Lxo12. The vertical axis of FIG. 5 is the critical thickness tc ($\times 10^{-1}$ nm). The characteristics are derived based on the People-Bean formula. In the model used in the derivation, Poisson's ratio is set to 0.3; and the slip length is set to 0.4 nm.

As shown in FIG. 5, the critical thickness tc is extremely large for Cr. For Pd, the critical thickness tc is about 12 nm. For Ir, the critical thickness tc is about 5 nm. For Rh, the critical thickness tc is about 0.6 nm.

For example, in the case where the thickness tm2 of the second magnetic layer 12 is about 1 nm to 3 nm, by using Pd or Ir as the conductive layer 20, the second magnetic layer 12 in which the lattice is continuous is obtained stably without the distortion relaxing. For example, in the case where the thickness tm2 of the second magnetic layer 12 is about 0.2 nm to 0.6 nm, by using Rh as the conductive layer 20, the second magnetic layer 12 in which the lattice is continuous is obtained stably without the distortion relaxing.

For example, in the case where Rh is used as the conductive layer 20, if the thickness tm2 of the second magnetic layer 12 is large and exceeds about 0.6 nm, it is considered that the distortion relaxes; the lattice becomes discontinuous; and it is difficult to obtain stable distortion in the second magnetic layer 12.

Experimental results for the magnetic properties when changing the thickness tm2 of the second magnetic layer 12 will now be described.

Figure 6:
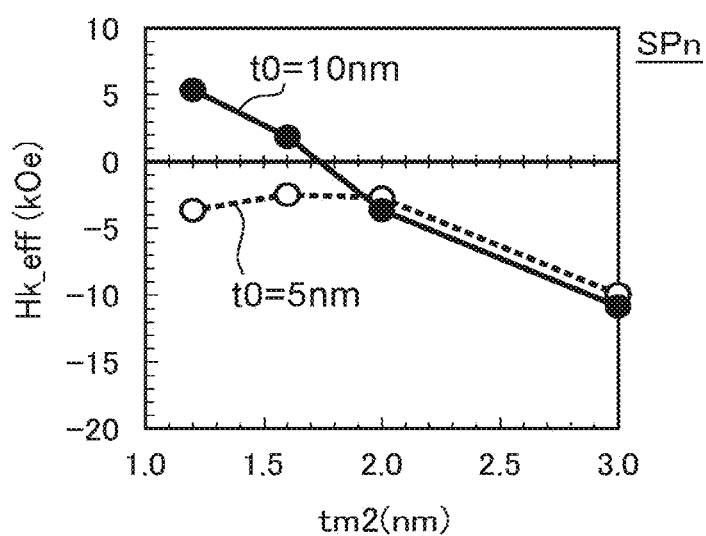
FIG. 6 is a graph illustrating the characteristics of the magnetic memory device.

FIG. 6 is a graph illustrating the characteristics of the magnetic memory device.

FIG. 6 shows the evaluation results of the perpendicular magnetic anisotropy field Hk_eff for a sample SPn. For the sample SPn, the lower layer 25L and the Ta film 42f are similar to the lower layer 25L (the Cr film 25e (10 nm)/MgO film 25d (3 nm)/CoFeB film 25c (2 nm)/Ta film 25b (3 nm)/substrate 25a) and the Ta film 42f illustrated in FIG. 3.

In the sample SPn, the conductive film 20f is an Ir film. The thickness (the thickness t0) of the Ir film is 5 nm or 10 nm. The second magnetic film 12f is a $Co_{50}Fe_{50}$ film. The thickness of the second magnetic film 12f corresponds to the thickness tm2 of the second magnetic layer 12. The thickness tm2 is modified in a range of 1.2 nm to 3.0 nm. The first nonmagnetic film 11nf is a MgO film having a thickness of 1.5 nm. Otherwise, the sample SPn is similar to the sample SP0.

The horizontal axis of FIG. 6 is the thickness tm2 (nm) of the second magnetic layer 12. The vertical axis is the perpendicular magnetic anisotropy field Hk_eff (kOe). As shown in FIG. 6, the perpendicular magnetic anisotropy field Hk_eff of the CoFe film (the second magnetic film 12f, i.e., the second magnetic layer 12) changes due to the thickness t0 of the Ir film (the conductive film 20f, i.e., the conductive layer 20).

The perpendicular magnetic anisotropy field Hk_eff is positive when the thickness t0 of the conductive layer 20 is 10 nm and the thickness tm2 of the second magnetic layer 12 is 1.6 nm or less. In such a case, the second magnetic layer 12 is a perpendicular magnetization film. The perpendicular magnetic anisotropy field Hk_eff is negative when the thickness t0 of the conductive layer 20 is 10 nm and the thickness tm2 of the second magnetic layer 12 exceeds 1.6 nm. In such a case, the second magnetic layer 12 is an in-plane magnetization film. On the other hand, the perpendicular magnetic anisotropy field Hk_eff is negative when the thickness t0 of the conductive layer 20 is 5 nm regardless of the thickness tm2 of the second magnetic layer 12.

In the range in which the thickness tm2 is 2.0 nm or less, the difference of the perpendicular magnetic anisotropy fields Hk_eff is large between when the thickness t0 of the conductive layer 20 is 10 nm and 5 nm.

It is considered that the lower layer 25L affects the characteristics of the Ir film (the conductive layer 20) when the thickness t0 of the conductive layer 20 is 5 nm. Further, it is considered that the Ir film (the conductive layer 20) that is affected by the lower layer 25L affects the characteristics of the $Co_{50}Fe_{50}$ film (the second magnetic layer 12). When the thickness t0 of the conductive layer 20 is 10 nm, it is considered that the effects of the lower layer 25L on the Ir film (the conductive layer 20) become small; and the effects of the conductive layer 20 (the Ir film) on the characteristics of the $Co_{50}Fe_{50}$ film (the second magnetic layer 12) become large.

For example, the crystal distortion of the $Co_{50}Fe_{50}$ film (the second magnetic layer 12) can be adjusted appropriately by an appropriate thickness t0 of the conductive layer 20.

Figure 7A:
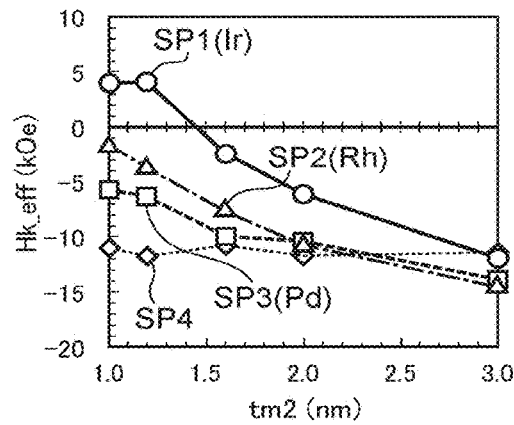
FIG. 7A and FIG. 7B are graphs illustrating characteristics of the magnetic memory device.
Figure 7B:
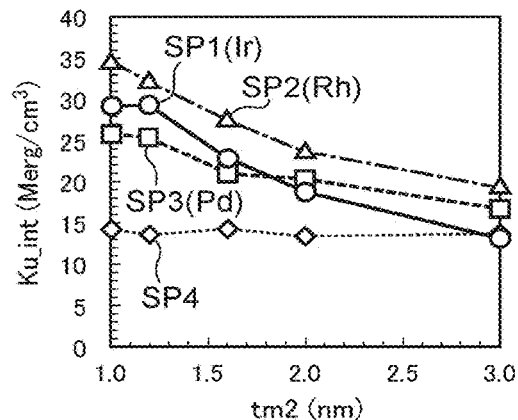

FIG. 7A and FIG. 7B are graphs illustrating characteristics of the magnetic memory device. The evaluation results of first to fourth samples SP1 to SP4 are shown in these drawings. In these samples, the lower layer 25L and the Ta film 42f are similar to the lower layer 25L and the Ta film 42f illustrated in FIG. 3.

In the first sample SP1, the conductive film 20f is an Ir film. In the second sample SP2, the conductive film 20f is a Rh film. In the third sample SP3, the conductive film 20f is a Pd film. In the fourth sample SP4, the conductive film 20f is not provided. In other words, in the fourth sample SP4, the Cr film 25e (having a thickness of 10 nm) of the lower layer 25L contacts the second magnetic film 12f. In the first to third samples SP1 to SP3, the thickness (the thickness t0) of the conductive film 20f is 10 nm.

In the first to fourth samples SP1 to SP4, the second magnetic film 12f is a $Co_{50}Fe_{50}$ film. The thickness (the thickness tm2) of the second magnetic film 12f is modified in a range of 1.0 nm to 3.0 nm. In the first to fourth samples SP1 to SP4, the first nonmagnetic film 11nf is a MgO film having a thickness of 1.5 nm. Otherwise, the first to fourth samples SP1 to SP4 are similar to the sample SP0. The film formation is performed by sputtering at room temperature. After the film formation, heat treatment is performed for 1 hour at 300° C.

In FIG. 7A and FIG. 7B, the horizontal axis is the thickness tm2 (nm). The vertical axis of FIG. 7A is the perpendicular magnetic anisotropy field Hk_eff (kOe). The vertical axis of FIG. 7B is a perpendicular magnetic anisotropy energy Ku_int (Merg/cm$^3$).

It can be seen from FIG. 7A that the effective perpendicular magnetic anisotropy field Hk_eff of the second magnetic film 12$f$ (the $Co_{50}Fe_{50}$ film) decreases as the thickness tm2 of the second magnetic film 12$f$ (the $Co_{50}Fe_{50}$ film) increases. The $Co_{50}Fe_{50}$ film is an in-plane magnetization film when the thickness tm2 is thick. The change of the effective perpendicular magnetic anisotropy field Hk_eff with respect to the film thickness tm2 is different according to the type of the material of the conductive film 20$f$. For example, there is a tendency for the effective perpendicular magnetic anisotropy field Hk_eff of Ir to be larger than the effective perpendicular magnetic anisotropy field Hk_eff of Rh. There is a tendency for the effective perpendicular magnetic anisotropy field Hk_eff of Rh to be larger than the effective perpendicular magnetic anisotropy field Hk_eff of Pd. There is a tendency for the effective perpendicular magnetic anisotropy field Hk_eff of Pd to be larger than the perpendicular magnetic anisotropy field Hk_eff of Cr.

It can be seen from FIG. 7A that a large distortion is applied to the $Co_{50}Fe_{50}$ film when the thickness tm2 is 1.2 nm or less for the first sample SP1 (the case of Ir). Thereby, it is considered that the perpendicular magnetization film is obtained.

It can be seen from FIG. 7B that the perpendicular magnetic anisotropy energy Ku_int decreases as the thickness tm2 increases. It is considered that this is because the lattice distortion is relaxed gradually as the thickness tm2 increases. It can be seen from FIG. 7A that the thickness tm2 where the perpendicular magnetization film changes to the in-plane magnetization film is about 1.5 nm.

For the $Co_{50}Fe_{50}$ film, there is a relationship between the range of the thickness tm2 where the large crystal distortion is applied and the perpendicular magnetic anisotropy is obtained and the magnitude of the lattice mismatch between the $Co_{50}Fe_{50}$ film and the conductive film 20$f$. As described in reference to FIG. 5, the magnitude of the lattice mismatch for the $Co_{50}Fe_{50}$ is as follows. The lattice mismatch of Rh is larger than the lattice mismatch of Ir. The lattice mismatch of Ir is larger than the lattice mismatch of Pd. The lattice mismatch of Pd is larger than the lattice mismatch of Cr. The critical thickness tc at which a constant lattice distortion is applied is as follows. The critical thickness tc of Rh is thinner than the critical thickness tc of Ir. The critical thickness tc of Ir is thinner than the critical thickness tc of Pd. The critical thickness tc of Pd is thinner than the critical thickness tc of Cr. The relationship of the critical thickness tc agrees with the characteristics illustrated in FIG. 7B.

In the case where the conductive film 20$f$ is Rh, it is considered that relaxation of the crystal distortion occurs when the thickness tm2 of the $Co_{50}Fe_{50}$ film is 1 nm. In the experimental results of the thickness tm2 in the range of not less than 1 nm and not more than 3 nm, a large crystal magnetic anisotropy energy is obtained when the value of the lattice mismatch is large.

Figure 8A:
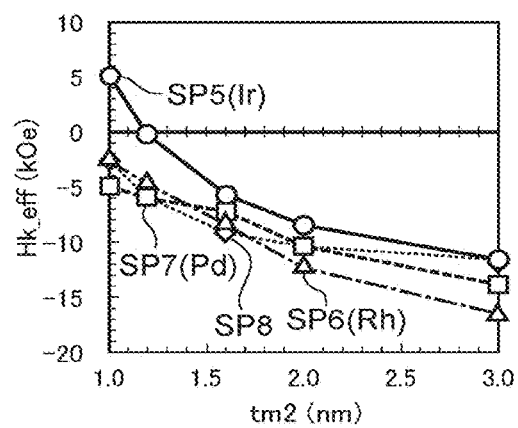
FIG. 8A and FIG. 8B are graphs illustrating characteristics of the magnetic memory device.
Figure 8B:
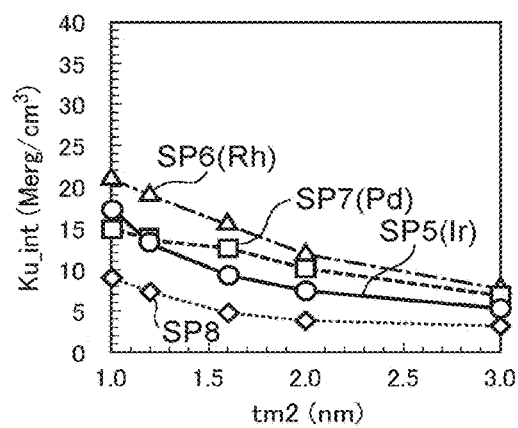

FIG. 8A and FIG. 8B are graphs illustrating characteristics of the magnetic memory device. The evaluation results of fifth to eighth samples SP5 to SP8 are shown in these drawings. In these samples, the lower layer 25L and the Ta film 42$f$ are similar to the lower layer 25L and the Ta film 42$f$ illustrated in FIG. 3.

In the fifth sample SP5, the conductive film 20$f$ is an Ir film. In the sixth sample SP6, the conductive film 20$f$ is a Rh film. In the seventh sample SP7, the conductive film 20$f$ is a Pd film. In the eighth sample SP8, the conductive film 20$f$ is not provided. In other words, in the eighth sample SP8, the Cr film 25$e$ (having a thickness of 10 nm) of the lower layer 25L contacts the second magnetic film 12$f$. In the fifth to seventh samples SP5 to SP7, the thickness (the thickness t0) of the conductive film 20$f$ is 10 nm.

In the fifth to eighth samples SP5 to SP8, the second magnetic film 12$f$ is a CoFeB film. In the CoFeB film, the composition ratio of Co is 40 atm % (atomic percent); the composition ratio of Fe is 40 atm %; and the composition ratio of B is 20 atm %. The second magnetic film 12$f$ is a $Co_{40}Fe_{40}B_{20}$ film. The thickness (the thickness tm2) of the second magnetic film 12$f$ is modified in the range of 1.0 nm to 3.0 nm. In the fifth to eighth samples SP5 to SP8, the first nonmagnetic film 11$nf$ is a MgO film having a thickness of 1.5 nm. Otherwise, the fifth to eighth samples SP5 to SP8 are similar to the sample SP0. The film formation is performed by sputtering at room temperature. After the film formation, heat treatment is performed for 1 hour at 300° C.

In FIG. 8A and FIG. 8B, the horizontal axis is the thickness tm2 (nm). The vertical axis of FIG. 8A is the perpendicular magnetic anisotropy field Hk_eff (kOe). The vertical axis of FIG. 8B is the perpendicular magnetic anisotropy energy Ku_int (Merg/cm$^3$).

It can be seen from FIG. 8A that the effective perpendicular magnetic anisotropy field Hk_eff decreases as the thickness tm2 of the second magnetic film 12$f$ (the $Co_{40}Fe_{40}B_{20}$ film) increases. It can be seen from FIG. 8B that the perpendicular magnetic anisotropy energy Ku_int decreases as the thickness tm2 increases.

For example, as shown in FIG. 8A, for the fifth sample SP5 (the case of Ir), the magnetization characteristic of the $Co_{40}Fe_{40}B_{20}$ film changes from the perpendicular magnetization film to the in-plane magnetization film as the thickness tm2 of the second magnetic film 12$f$ (the $Co_{40}Fe_{40}B_{20}$ film) increases. It can be seen from FIG. 8A that the thickness tm2 where the perpendicular magnetization film changes to the in-plane magnetization film is about 1.2 nm.

An example of evaluation results of the spin Hall angle for the fifth to eighth samples SP5 to SP8 will now be described.

Figure 9:
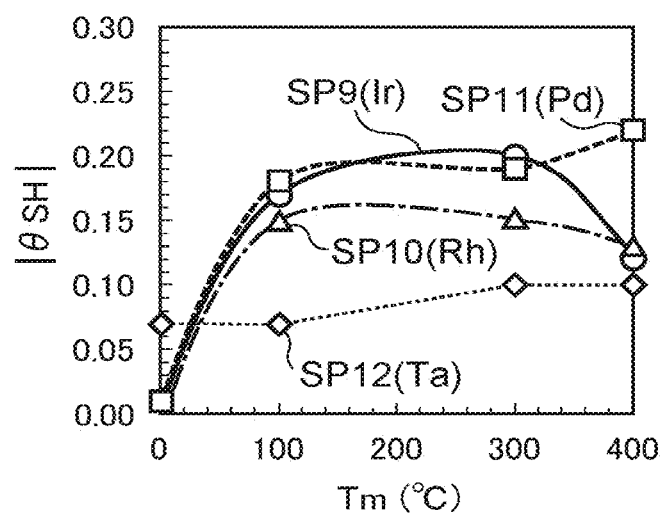
FIG. 9 is a graph illustrating the characteristics of the magnetic memory device.

FIG. 9 is a graph illustrating the characteristics of the magnetic memory device.

The evaluation results of the spin Hall angle for ninth to twelfth samples SP9 to SP12 are shown in FIG. 9. In these samples, the conductive film 20$f$ is provided on the substrate 25$a$. The second magnetic film 12$f$ is provided on the conductive film 20$f$. The first nonmagnetic film 11$nf$ is provided on the second magnetic film 12$f$. In this sample, the first nonmagnetic film 11$nf$ is a MgO film having a thickness of 1.5 nm. The Ta film 42$f$ (having a thickness of 1 nm) is provided on the first nonmagnetic film 11$nf$. The lower layer 25L is not provided in the ninth to twelfth samples SP9 to SP12.

In the ninth sample SP9, the conductive film 20$f$ is an Ir film. In the tenth sample SP10, the conductive film 20$f$ is a Rh film. In the eleventh sample SP11, the conductive film 20$f$ is a Pd film. In the twelfth sample SP12, the conductive film 20$f$ is a Ta film. In the ninth to twelfth samples SP9 to SP12, the thickness (the thickness t0) of the conductive film 20$f$ is 3 nm.

In the ninth to twelfth samples SP9 to SP12, the second magnetic film 12$f$ is a CoFeB film. In the CoFeB film, the composition ratio of Co is 40 atm %; the composition ratio of Fe is 40 atm %; and the composition ratio of B is 20 atm %. The second magnetic film 12$f$ is a $Co_{40}Fe_{40}B_{20}$ film. The thickness (the thickness tm2) of the second magnetic film 12$f$ is 1.8 nm. In each of these samples, the film formation is performed by sputtering at room temperature. The temperature of the heat treatment after the film formation is modified.

The horizontal axis of FIG. 9 is a temperature Tm (° C.) of the heat treatment. The vertical axis is an absolute value |θSH| of the spin Hall angle. In FIG. 9, the value when the temperature Tm of the heat treatment is "0" corresponds to the value of "no heat treatment."

For the twelfth sample SP12 (Ta) as shown in FIG. 9, the absolute value |θSH| of the spin Hall angle does not change greatly due to the performance/non-performance of the heat treatment. For the twelfth sample SP12 (Ta), the absolute value |θSH| of the spin Hall angle is small and is about 0.07 to 0.10.

Conversely, for the ninth to eleventh samples SP9 to SP11, the absolute value |θSH| of the spin Hall angle is substantially zero in the case where the heat treatment is not performed. Also, the absolute value |θSH| of the spin Hall angle increases due to the heat treatment. For example, the absolute value |θSH| of the spin Hall angle is about 0.20 for the ninth sample SP9 (Ir) for which the temperature Tm of the heat treatment is 100° C. or more. The absolute value |θSH| of the spin Hall angle is about 0.15 for the tenth sample SP10 (Rh). The absolute value |θSH| of the spin Hall angle is about 0.22 for the eleventh sample SP11 (Pd).

Thus, a spin Hall angle that has a large absolute value is obtained by performing heat treatment using Rh, Pd, or Ir as the conductive layer 20.

As described below, it is considered that the B that is included in the second magnetic layer 12 (CoFeB) moves (diffuses) into the conductive layer 20 due to the heat treatment. In other words, it is considered that the second region 22 including B and the first region 21 having a low concentration of B are formed in the conductive layer 20. As recited above, because the absolute value |θSH| of the spin Hall angle increases due to the heat treatment, it is considered that the absolute value |θSH| of the spin Hall angle increases due to the second region 22 including B. It is considered that the B included in the second region 22 scatters the electrons. It is considered that the scattering of the electrons by the B element promotes spin splitting. As a result, it is considered that the absolute value |θSH| of the spin Hall angle increases. It is considered that a large spin Hall effect (or spin-orbit coupling) is obtained due to the second region 22 including B.

It is known that the spin Hall effect is obtained in metals such as Ta, W, etc. According to the experimental results shown in FIG. 9, it was found that a large spin Hall effect is obtained for the special configuration in which a metal such as Rh, Pd, Ir, etc., includes B. It is considered that this phenomenon is a special phenomenon in the case where B is included.

By using a metal such as Rh, Pd, Ir, etc., as the conductive layer 20 as described above, the distortion of the crystal is generated in the second magnetic layer 12; and a large voltage effect is obtained. Also, a large voltage effect is obtained even in the case where B is included in a portion of such a conductive layer 20. At this time, in the case where the concentration of B is high in the entire conductive layer 20, the crystal of the conductive layer 20 easily becomes unstable; and there are cases where the distortion of the crystal cannot be introduced sufficiently into the second magnetic layer 12. On the other hand, the absolute value |θSH| of the spin Hall angle is large because the metal such as Rh, Pd, Ir, etc., includes B. In other words, a large spin Hall effect is obtained. It is sufficient for the second region 22 that includes B to be provided in a portion proximal to the second magnetic layer 12 (e.g., a portion contacting the second magnetic layer 12).

A large spin Hall effect is obtained by the portion (the second region 22) proximal to the second magnetic layer 12 including B. Also, the first region 21 that has a low concentration of B is provided under the second region 22. Thereby, the lattice of the conductive layer 20 stabilizes. By such a configuration, the distortion of the crystal can be introduced effectively to the second magnetic layer 12 by the lattice constant difference between the conductive layer 20 and the second magnetic layer 12. Thereby, a large voltage effect is obtained.

The resistivity of Ta is 160 μΩcm. Conversely, the resistivities of metals such as Rh, Pd, Ir, etc., are about 30 μΩcm. By using a metal such as Rh, Pd, Ir, etc., as the conductive layer 20, the conductive layer 20 can be thin. The second magnetization 12M of the second magnetic layer 12 can be reversed by a small current (the first current Iw1, the second current Iw2, etc.). For example, characteristic degradation due to heat generation can be suppressed.

For example, a large voltage effect and a large spin Hall effect are obtained by using the first region 21 that includes a first metal such as Rh, Pd, Ir, etc., and the conductive layer 20 that includes the second region 22 including the first metal and B. Then, the magnetization reversal is possible using a small current. Stable operations are possible.

The concentration (the second concentration) of boron (B) in the second region 22 is, for example, 30 atomic percent or less. For example, a large voltage effect is obtained when the second concentration is 30 atomic percent or less. When the second concentration exceeds 30 atomic percent, for example, there are cases where amorphization occurs in the second region 22 (the crystal lattice is not formed). The second concentration is, for example, 1 atomic percent or more. For example, a large spin Hall effect is obtained when the second concentration is 1 atomic percent or more. For example, a large spin Hall effect is obtained stably when the second concentration is 10 atomic percent or more.

The second magnetic layer 12 may not include B. For example, the second magnetic layer 12 that does not include boron may be formed as the conductive layer 20 by forming the second region 22 including boron on the first region 21 having a low concentration of boron. Even in such a case, a large voltage effect and a large spin Hall effect are obtained. In such a case, the concentration of B in the second magnetic layer 12 may be lower than the concentration (the second concentration) of boron in the second region 22. In the case where the second region 22 includes boron, at least a portion of the second region 22 may be crystallized.

On the other hand, as described above, boron may be introduced to the conductive film 20f by forming the second magnetic film 12f including boron on the conductive film 20f not including boron and by performing heat treatment. Thereby, the second region 22 may be formed.

Figure 10A:
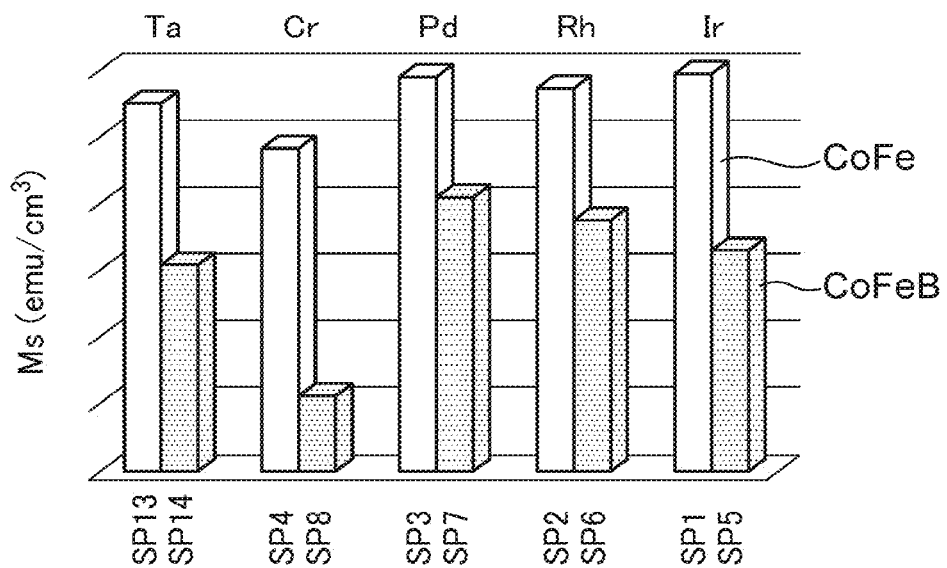
FIG. 10A and FIG. 10B are graphs illustrating characteristics of the magnetic memory device.
Figure 10B:
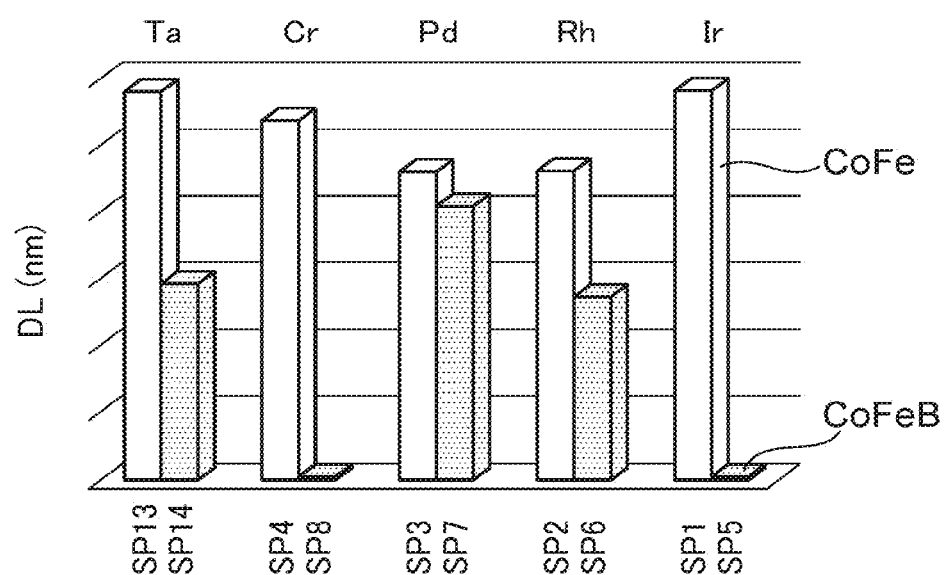

FIG. 10A and FIG. 10B are graphs illustrating characteristics of the magnetic memory device.

These figures show evaluation results of a saturation magnetization Ms and a thickness DL of a magnetic dead layer for the first to eighth samples SP1 to SP8 described above. In the first to eighth samples SP1 to SP8 as described above, the material of the second magnetic film 12f (i.e., the second magnetic layer 12) is CoFe or CoFeB. In the first to eighth samples SP1 to SP8, the thickness tm2 of the second magnetic film 12f (i.e., the second magnetic layer 12) is modified in a range of 1 nm to 3 nm. The saturation magnetization Ms and the thickness DL of the magnetic dead layer are derived from the measurement results of the magnetic properties of the samples having different thicknesses tm2. The magnetizations are measured for the samples including magnetic layers having different thicknesses. The saturation magnetization Ms and the thickness DL of the magnetic dead layer can be derived by verifying the linear relation between the amount of the magnetization and the thickness of the magnetic layer. A magnetization is not generated in the magnetic dead layer. As described above, the thickness (the thickness t0) of the conductive film 20f is 10 nm in the first to eighth samples SP1 to SP8.

The evaluation results of a thirteenth sample SP13 and a fourteenth sample SP14 also are shown in FIG. 10A and FIG. 10B. In the thirteenth sample SP13 and the fourteenth sample SP14, a Ta film having a thickness of 10 nm is provided on the substrate 25a. The Ta film corresponds to the conductive film 20f. In the thirteenth sample SP13, a CoFe film (a $Co_{50}Fe_{50}$ film) is provided on the Ta film. On the other hand, in the fourteenth sample SP14, a CoFeB film (a $Co_{40}Fe_{40}B_{20}$ film) is provided on the Ta film. The CoFe film or the CoFeB film corresponds to the second magnetic layer 12. In the thirteenth sample SP13 and the fourteenth sample SP14, the first nonmagnetic film 11nf (a MgO film having a thickness of 1.5 nm) is provided on the CoFe film or the CoFeB film; and the Ta film 42f (having a thickness of 3 nm) is provided on the first nonmagnetic film 11nf. The saturation magnetization Ms and the thickness DL of the magnetic dead layer are derived for the thirteenth sample SP13 and the fourteenth sample SP14 as well.

The vertical axis of FIG. 10A is the saturation magnetization Ms ($emu/cm^3$). The vertical axis of FIG. 10B is the thickness DL of the magnetic dead layer (nm).

As shown in FIG. 10A, the saturation magnetization Ms is large in the case where the second magnetic film 12f is the CoFe film. The saturation magnetization Ms is substantially not affected by the difference of the types of the materials of the conductive film 20f.

On the other hand, the saturation magnetization Ms in the case where the second magnetic film 12f is the CoFeB film is small compared to the saturation magnetization Ms in the case of the CoFe film. The saturation magnetization Ms for the CoFeB film is greatly dependent on the type of the material of the conductive film 20f. For example, the saturation magnetization Ms of the eighth sample SP8 in which the material of the conductive film 20f is Cr is markedly smaller than the saturation magnetization Ms of the fourteenth sample SP14 in which the material of the conductive film 20f is Ta.

Generally, the saturation magnetization Ms of a CoFeB film is smaller than the saturation magnetization Ms of a CoFe film. B is absorbed less easily by Cr than by Ta. Therefore, in the case where Cr is used as the conductive film 20f, the concentration of B of the CoFeB film substantially does not change. Therefore, it is considered that the saturation magnetization Ms of the eighth sample SP8 (the CoFeB film) is small compared to the saturation magnetization Ms of the fourth sample SP4 (the CoFe film).

Conversely, Ta easily absorbs B. Therefore, it is considered that the concentration of B in the CoFeB film decreases in the case where Ta is used as the conductive film 20f. Therefore, it is considered that the saturation magnetization Ms of the fourteenth sample SP14 (the CoFeB film) is relatively large and is close to the saturation magnetization Ms of the thirteenth sample SP13 (the CoFe film).

Even in the case where another material (Ir, Rh, or Pd) is used as the conductive film 20f, the saturation magnetization Ms of the CoFeB film is relatively large and is close to the saturation magnetization Ms of the CoFe film. Therefore, it is considered that B is absorbed easily also by these other materials (Ir, Rh, and Pd).

As shown in FIG. 10B, the thickness DL of the magnetic dead layer is large in the case where the second magnetic film 12f is a CoFe film. The thickness DL of the magnetic dead layer is substantially not affected by the difference of the types of the materials of the conductive film 20f.

On the other hand, in the case where the second magnetic film 12f is the CoFeB film, the thickness DL of the magnetic dead layer is greatly dependent on the type of the material of the conductive film 20f. For example, the thickness DL of the magnetic dead layer is markedly small in the case where the material of the conductive film 20f is Ir or Cr (the fifth sample SP5 and the eighth sample SP8).

The flatness of the Ir film is exceedingly good. It is considered that there is a relationship with the markedly small thickness DL of the magnetic dead layer. For example, it is considered that the effects due to B diffusion are slight in the Ir film. There is a possibility that there is a relationship with the markedly small thickness DL of the magnetic dead layer.

The thickness DL of the magnetic dead layer is substantially zero in the case where Ir is used as the conductive layer 20. It is considered that it is particularly favorable for the conductive layer 20 to include Ir. It is considered that a special phenomenon occurs in which the Ir film effectively absorbs the B inside the CoFeB film, and the thickness DL of the magnetic dead layer becomes small due to the B absorbed by the Ir film.

For example, the magnetization of the magnetic layer may be determined by a vibrating sample magnetometer (VSM), etc. For example, the thickness DL of the magnetic dead layer may be determined by a measurement of the magneto-optic Kerr effect.

An example of experimental results relating to the composition ratios for the case where the second magnetic layer 12 includes CoFe will now be described.

FIG. 11A to FIG. 11D are graphs illustrating the characteristics of the magnetic memory device.

Figure 11A:
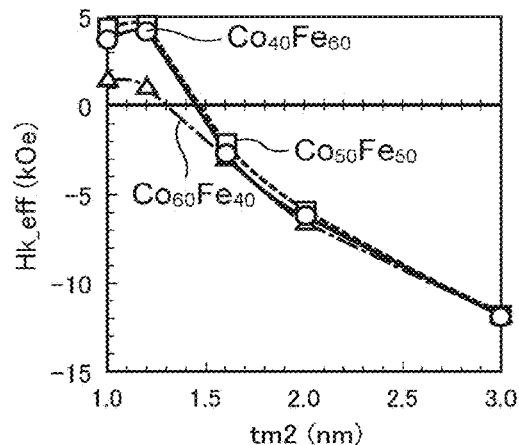
FIG. 11A to FIG. 11D are graphs illustrating the characteristics of the magnetic memory device.
Figure 11B:
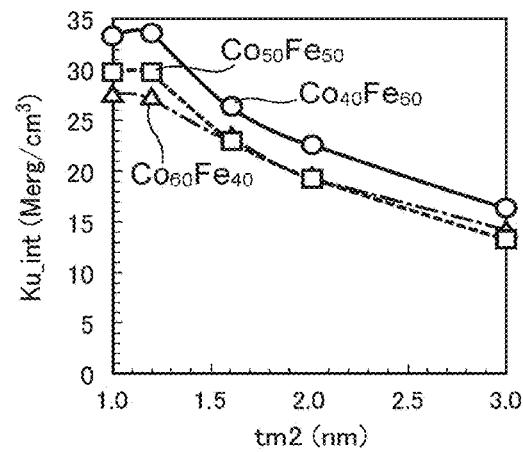
Figure 11C:
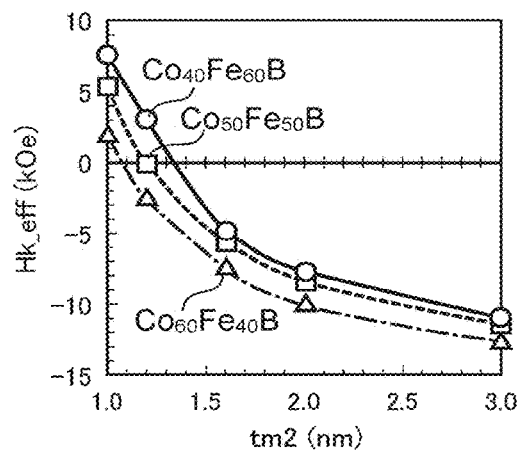
Figure 11D:
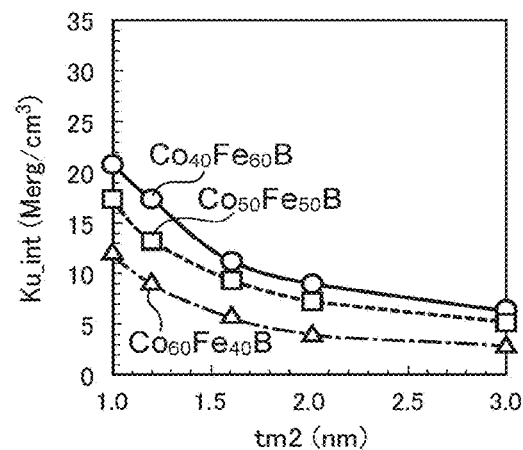

In FIG. 11A and FIG. 11B, the second magnetic layer 12 (the second magnetic film 12f) is a CoFe film. In FIG. 11C and FIG. 11D, the second magnetic layer 12 (the second magnetic film 12f) is a CoFeB film.

In the samples of these figures, the lower layer 25L and the Ta film 42f are similar to the lower layer 25L and the Ta film 42f illustrated in FIG. 3. In these samples, an Ir film (the conductive film 20f) that has a thickness of 10 nm is provided on the Cr film 25e of the lower layer 25L. The CoFe film or the CoFeB film are provided as the second magnetic film 12f on the Ir film. The composition ratio of Co and Fe are modified in the CoFe film and the CoFeB film. In the CoFeB film, the concentration of B is 20 atm %. The thickness (the thickness tm2) is modified in the range of 1 nm to 3 nm for the CoFe film or the CoFeB film. A MgO film (the first nonmagnetic film 11nf) is provided on the CoFe film or the CoFeB film. The thickness of the MgO film is 1.5 nm. The Ta film 42f is provided on the MgO film.

In FIG. 11A to FIG. 11D, the horizontal axis is the thickness tm2 (nm). In FIG. 11A and FIG. 11C, the vertical axis is the perpendicular magnetic anisotropy field Hk_eff (kOe). In FIG. 11B and FIG. 11D, the vertical axis is the perpendicular magnetic anisotropy energy Ku_int (Merg/$cm^3$).

It can be seen from FIG. 11A to FIG. 11D that a large perpendicular magnetic anisotropy is obtained for the compositions from $Co_{40}Fe_{60}$ to $Co_{50}Fe_{50}$ for both the CoFe film and the CoFeB film. A particularly large perpendicular magnetic anisotropy is obtained for the composition of $Co_{40}Fe_{60}$. For example, it is considered that the magnetocrystalline anisotropy or the interface magnetic anisotropy acts greatly for the Fe rich composition.

In the embodiment, the composition may be from the $Co_{40}Fe_{60}$ to $Co_{60}Fe_{40}$ for either of the CoFe film or the CoFeB film. For example, the second magnetic layer 12 may include $Co_{x1}Fe_{1-x1}$ ($0 \leq x1 \leq 0.6$). The second magnetic layer 12 may include $Co_{x1}Fe_{1-x1}$ ($0.4 \leq x1 \leq 0.6$). The second magnetic layer 12 may include $Co_{x1}Fe_{1-x1}$ ($0.4 \leq x1 \leq 0.5$). The second magnetic layer 12 may include $Co_{x1}Fe_{1-x1}$ ($0.4 \leq x1 \leq 0.45$). In such a case, a stable perpendicular magnetic anisotropy is obtained.

FIG. 12A to FIG. 12H are microscope photographs illustrating the magnetic memory device.

In the samples shown in these figures, an Ir film (the conductive film 20f) that has a thickness of 10 nm is provided on the lower layer 25L (referring to FIG. 3); a CoFe film (the second magnetic film 12f) that has a thickness of 2 nm is provided on the Ir film; a MgO film (the first nonmagnetic film 11nf) that has a thickness of 3 nm is provided on the CoFe film; and the Ta film 42f (referring to FIG. 3) is provided on the MgO film.

FIG. 12A is a cross section HAADF-STEM (high-angle annular dark-field scanning transmission electron microscopy) image of the sample. FIG. 12B to FIG. 12H are energy dispersive X-ray spectroscopy (EDS) images of the samples. FIG. 12B corresponds to the K line of O (oxygen). FIG. 12C corresponds to the K line of Mg. FIG. 12D corresponds to the K line of Cr. FIG. 12E corresponds to the K line of Fe. FIG. 12F corresponds to the K line of Co. FIG. 12G corresponds to the L line of Ir. FIG. 12H corresponds to the L line of Ta.

It can be seen from these figures that good crystal flatness is obtained in each of the multiple films included in the samples. It can be seen that high uniformity is obtained. The diffusion into the CoFe film (the second magnetic film 12f) of the elements included in the other films substantially does not occur. Trace Co and trace Fe diffuse into the Ir film (the conductive film 20f). Thus, the first element that is included in the second magnetic layer 12 may be included in the conductive layer 20.

Figure 13:
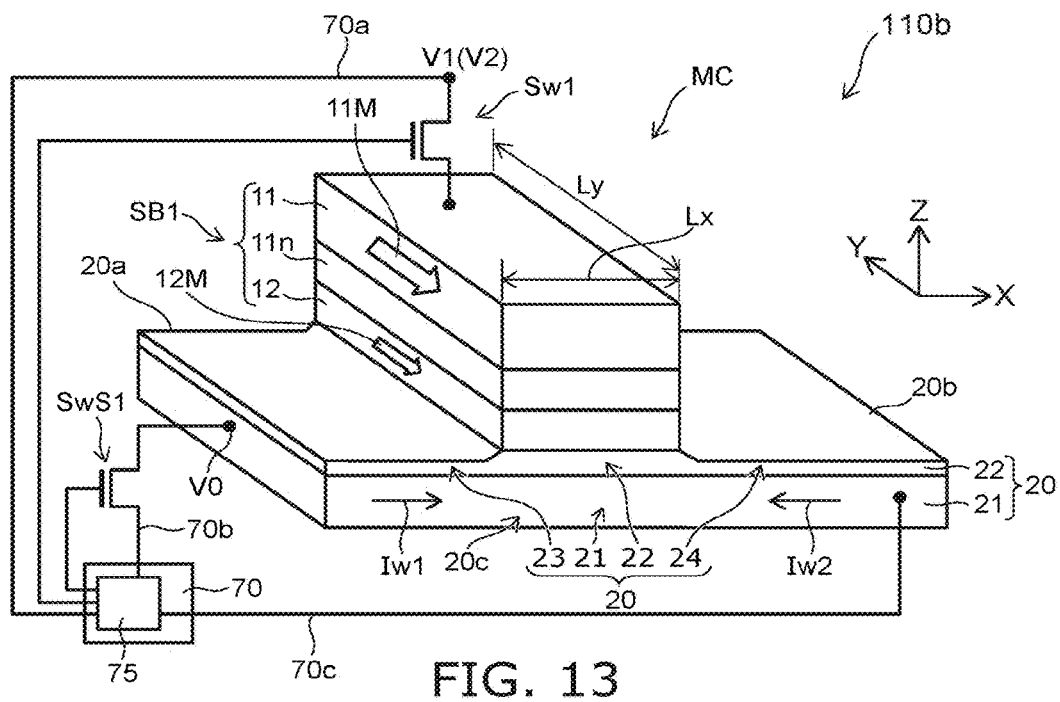
FIG. 13 is a schematic perspective view illustrating another magnetic memory device according to the first embodiment.

FIG. 13 is a schematic perspective view illustrating another magnetic memory device according to the first embodiment.

In the magnetic memory device 110b according to the embodiment as shown in FIG. 13, the thickness of a portion of the conductive layer 20 is thinner than the other portions. These configurations of the magnetic memory device 110b are similar to the configurations of the magnetic memory device 110a.

In the example, the conductive layer 20 further includes a third region 23 and a fourth region 24 in addition to the first region 21 and the second region 22. The second region 22 is between the third region 23 and the fourth region 24 in the second direction (the X-axis direction). In the example, the concentration of boron in the third region 23 and the concentration of boron in the fourth region 24 each are higher than the concentration (the first concentration) of boron in the first region 21. The thickness along the first direction (the Z-axis direction) of the second region 22 is thicker than the thickness along the first direction of the third region 23. The thickness along the first direction (the Z-axis direction) of the second region 22 is thicker than the thickness along the first direction of the fourth region 24.

A large voltage effect and a large spin Hall effect are obtained in such a magnetic memory device 110b as well. Stable operations are possible.

For example, the magnetic memory device 110b is formed by forming a stacked film including the second magnetic film 12f on the conductive film 20f including, for example, the first region 21 to the fourth region 24, and by subsequently patterning the stacked film. At this time, the magnetic memory device 110a or 110b is formed according to the conditions of the patterning. In other words, the magnetic memory device 110b is formed in the case where a portion of the conductive film 20f is removed in the patterning processing.

Figure 14:
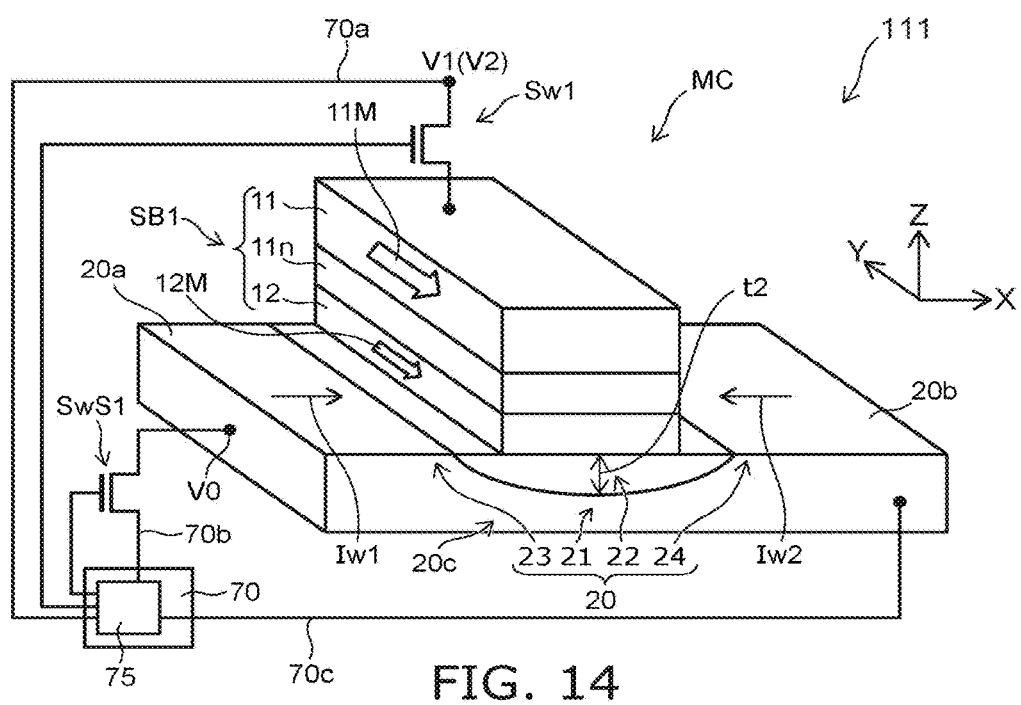
FIG. 14 is a schematic perspective view illustrating another magnetic memory device according to the first embodiment.

FIG. 14 is a schematic perspective view illustrating another magnetic memory device according to the first embodiment.

As shown in FIG. 14, the magnetic memory device 111 according to the embodiment also includes the conductive layer 20, the first magnetic layer 11, the second magnetic layer 12, the first nonmagnetic layer 11n, and the controller 70. In the magnetic memory device 111, the configuration of the conductive layer 20 is different from that of the magnetic memory device 110. Otherwise, the configuration of the magnetic memory device 111 is similar to the configuration of the magnetic memory device 110.

In the magnetic memory device 111, the conductive layer 20 further includes the third region 23 and the fourth region 24 in addition to the first region 21 and the second region 22. The second region 22 is between the third region 23 and the fourth region 24 in the second direction (the X-axis direction). For example, the third region 23 and the fourth region 24 do not include boron. Or, the concentration of boron in the third region 23 and the concentration of boron in the fourth region 24 each are lower than the concentration (the second concentration) of boron in the second region 22.

In the magnetic memory device 111, the portion of the conductive layer 20 overlapping the second magnetic layer 12 locally includes boron. In the magnetic memory device 111, the portion of the conductive layer 20 not overlapping the second magnetic layer 12 (e.g., the third region 23 and the fourth region 24) has a composition similar to that of the first region 21. For example, the resistance of the conductive layer 20 can be low. For example, there is a tendency for the resistivity of the second region 22 to be higher than the resistivities of the first region 21, the third region 23, and the fourth region 24. The resistance of the conductive layer 20 can be set to be low by locally providing a portion including boron.

Figure 15:
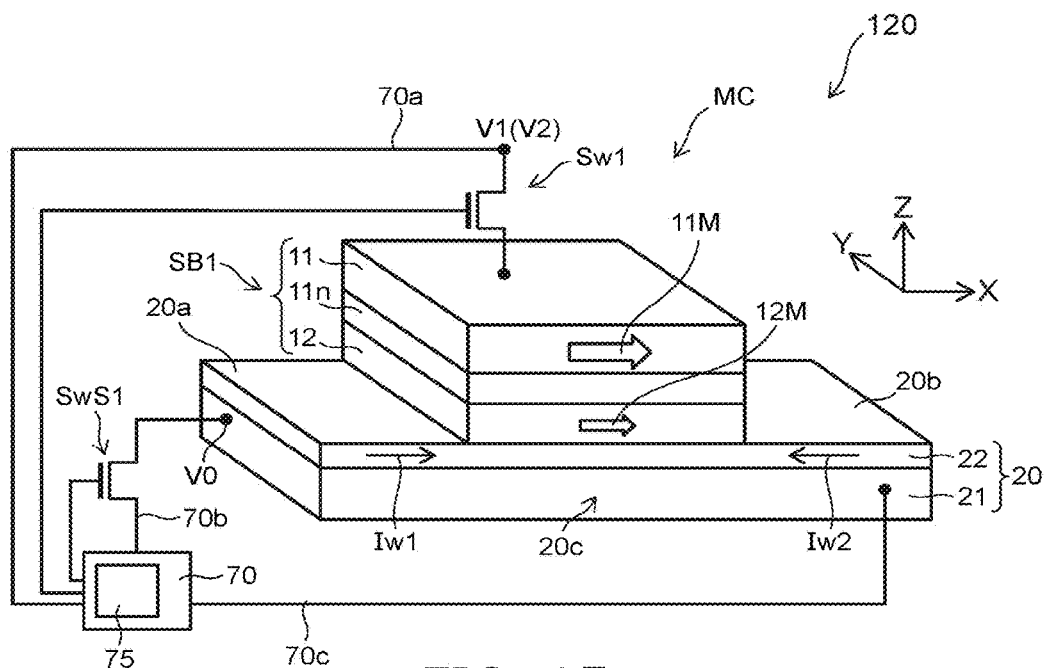
FIG. 15 is a schematic perspective view illustrating another magnetic memory device according to the first embodiment.

FIG. 15 is a schematic perspective view illustrating another magnetic memory device according to the first embodiment.

As shown in FIG. 15, the magnetic memory device 120 according to the embodiment also includes the conductive layer 20, the first magnetic layer 11, the second magnetic layer 12, the first nonmagnetic layer 11n, and the controller 70. In the magnetic memory device 120, the direction of the first magnetization 11M of the first magnetic layer 11 is different from that of the magnetic memory device 110. Otherwise, the configuration of the magnetic memory device 120 is similar to the configuration of the magnetic memory device 110.

In the magnetic memory device 120, the first magnetization 11M of the first magnetic layer 11 is aligned with the second direction (e.g., the X-axis direction). For example, the second magnetization 12M of the second magnetic layer 12 is substantially aligned with the second direction.

In the magnetic memory device 120, for example, a direct switching mode operation is performed. The speed of the magnetization reversal in the direct switching mode is higher than the speed of the magnetization reversal in a precessional switching mode. The magnetization reversal does not follow the precession in the direct switching mode. Therefore, the magnetization reversal rate is independent of the damping constant α. In the magnetic memory device 120, a high-speed magnetization reversal is obtained.

In the magnetic memory device 120, for example, the length in one direction (the length in the major-axis direction) of the first magnetic layer 11 is longer than the length in one other direction (the minor-axis direction length) of the first magnetic layer 11. For example, the length along the second direction (e.g., the X-axis direction) (the length in the major-axis direction) of the first magnetic layer 11 is longer than the length along the third direction (e.g., the Y-axis direction) (the minor-axis direction length) of the first magnetic layer 11. For example, the first magnetization 11M of the first magnetic layer 11 is easily aligned with the second direction due to the shape anisotropy.

In the magnetic memory device 120, for example, the major-axis direction of the first magnetic layer 11 is aligned with the second direction. The major-axis direction of the first magnetic layer 11 may be tilted with respect to the second direction. For example, the angle (the absolute value of the angle) between the major-axis direction of the first magnetic layer 11 and the second direction (a direction corresponding to the direction of the current flowing through the conductive layer 20) is, for example, not less than 0 degrees but less than 30 degrees. By such a configuration, for example, a high writing speed is obtained.

Figure 16:
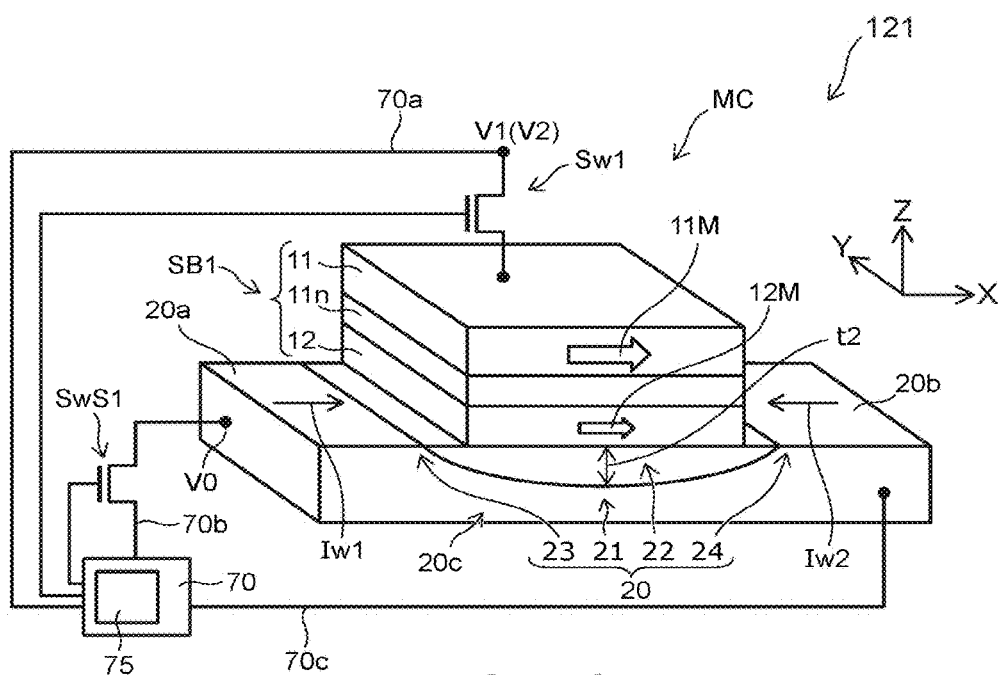
FIG. 16 is a schematic perspective view illustrating another magnetic memory device according to the first embodiment.

FIG. 16 is a schematic perspective view illustrating another magnetic memory device according to the first embodiment.

As shown in FIG. 16, the magnetic memory device 121 according to the embodiment also includes the conductive layer 20, the first magnetic layer 11, the second magnetic layer 12, the first nonmagnetic layer 11n, and the controller 70. In the magnetic memory device 121, the conductive layer 20 includes the first region 21, the second region 22, the third region 23, and the fourth region 24 described above. For example, the third region 23 and the fourth region 24 do not include boron. Or, the concentration of boron in the third region 23 and the concentration of boron in the fourth region 24 each are lower than the concentration (the second concentration) of boron in the second region 22. Otherwise, the configuration of the magnetic memory device 121 is similar to the configuration of the magnetic memory device 120.

Examples of the materials included in the various layers of the embodiment will now be described.

In the first embodiment, the second magnetic layer 12 includes, for example, at least one first element selected from the group consisting of Co, Fe and Ni. The second magnetic layer 12 may further include boron. The second magnetic layer 12 may further include at least one second element selected from the group consisting of C, N, O, Si, and P. In the second magnetic layer 12, the concentrations of boron and the second element are, for example, 30 atm % or less. Thereby, for example, at least one of the lattice constant, the crystallinity, the magnetic properties, the mechanical properties, or the chemical properties can be controlled. By using such a material, for example, a high spin polarization ratio is obtained. For example, the second magnetic layer 12 includes at least one selected from the group consisting of Co, Fe, CoFe, CoFeB, FeB, CoB, CoFeSi, CoFeP, FeNi, FeNiB, FeNiSi, and FeNiP. The second magnetic layer 12 may include a stacked film including multiple films having different compositions. The second magnetic layer 12 includes, for example, CoFeB/CoFe or CoFeB/FeNiB. The second magnetic layer 12 may include, for example, a stacked film including multiple CoFeB films having mutually-different compositions. The second magnetic layer 12 may include, for example, a stacked film including multiple CoFe films having mutually-different compositions.

The second magnetic layer 12 may include, for example, a magnetic layer including a Co-based Heusler alloy. The Co-based Heusler alloy is notated as $Co_2YZ$. The second magnetic layer 12 includes at least one selected from the group consisting of $Co_2FeAl$, $Co_2MnSi$, $Co_2MnGe$, $Co_2Mn(Si, Ge)$, and $Co_2Mn(Ga, Ge)$.

The second magnetic layer 12 may have, for example, a stacked structure. The stacked structure is, for example, a SAF structure. In the SAF structure, for example, the effects of the stray magnetic field on the adjacent bits can be reduced.

The stacked structure includes, for example, CoFe(B)/(Ta, W, Mo, Cu, Cr)/CoFe(B), a Co-based Heusler alloy/(Ta, W, Mo, Cu, Cr)/CoFe(B), etc. The notation "(Ta, W, Mo, Cu, Cr)" means the inclusion of at least one selected from the group consisting of Ta, W, Mo, Cu, and Cr. The SAF structure includes, for example, at least one selected from the group consisting of CoFe(B)/(Ru, Rh, Ir)/CoFe(B) and a Co-based Heusler alloy/(Ru, Rh, Ir)/CoFe(B). The notation "(Ru, Rh, Ir)" means the inclusion of at least one selected from the group consisting of Ru, Rh, and Ir. The notation "(B)" means that B is included, or B is substantially not included.

The second magnetic layer 12 may include a stacked body. The stacked body includes, for example, at least one selected from the group consisting of a Co/Pt artificial lattice, a Co/Pd artificial lattice, a Co/Ru artificial lattice, a Co/Ir artificial lattice, and a Co/Au artificial lattice. In these artificial lattices, the addition of elements and the ratio of the thicknesses of the magnetic films and the nonmagnetic film are adjusted. Thereby, for example, the perpendicular magnetic anisotropy and the saturation magnetization are adjusted.

The first magnetic layer 11 has at least one of a coercivity that is larger than the coercivity of the second magnetic layer 12, a magnetic anisotropy energy that is larger than the magnetic anisotropy energy of the second magnetic layer 12, or a damping constant that is larger than the damping constant of the second magnetic layer 12. Thereby, the change of the electrical resistance of the magnetic memory device is obtained stably. The first magnetic layer 11 may include a stacked film including a first layer and a second layer. The first layer includes, for example, Mn and at least one element selected from the group consisting of Ir, Pt, Fe, and Rh. The second layer includes at least one element selected from the group consisting of Co, Fe, and Ni. The first magnetic layer 11 includes, for example, at least one selected from the group consisting of IrMn/CoFe, PtMn/CoFe, FeMn/CoFe, and RhMn/CoFe. For example, a stable magnetization direction is obtained. The first magnetic layer 11 may include a first layer, a second layer, a third layer, and a fourth layer. The fourth layer is provided between the third layer and the second layer. For example, the third layer contacts the first nonmagnetic layer 11n and has, for example, a high spin polarization ratio. The first magnetic layer 11 includes, for example, at least one selected from the group consisting of IrMn/CoFe/Ru/CoFeB, PtMn/CoFe/Ru/

CoFeB, FeMn/Co Fe/Ru/CoFeB, and RhMn/CoFe/Ru/CoFeB. Thereby, for example, a stable magnetization direction is obtained. For example, the change of the electrical resistance of the magnetic memory device is obtained stably.

The first nonmagnetic layer 11n includes, for example, at least one selected from the group consisting of MgO, MgAlO, and AlO. The first nonmagnetic layer 11n may include a stacked film including multiple films including these materials. The first nonmagnetic layer 11n may further include other nonmagnetic metals.

Second Embodiment

Figure 17:
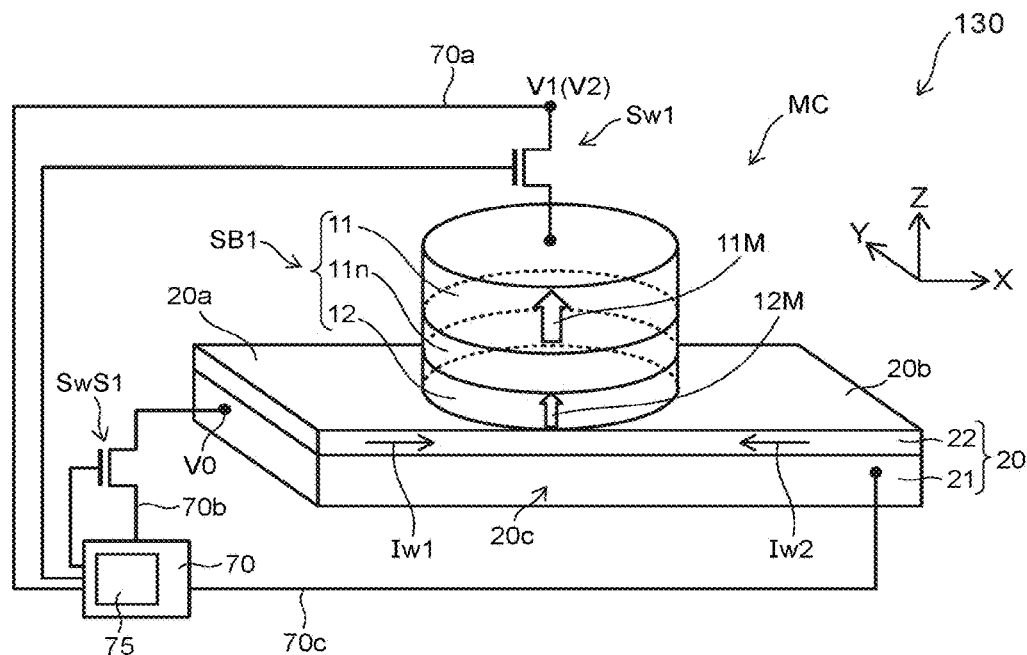
FIG. 17 is a schematic perspective view illustrating a magnetic memory device according to the second embodiment.

FIG. 17 is a schematic perspective view illustrating a magnetic memory device according to the second embodiment.

As shown in FIG. 17, the magnetic memory device 130 according to the second embodiment also includes the conductive layer 20, the first magnetic layer 11, the second magnetic layer 12, the first nonmagnetic layer 11n, and the controller 70. In the magnetic memory device 130, the direction of the first magnetization 11M of the first magnetic layer 11 is different from that of the magnetic memory device 110. Otherwise, the configuration of the magnetic memory device 130 is similar to the configuration of the magnetic memory device 110.

In the magnetic memory device 130, the first magnetization 11M of the first magnetic layer 11 is aligned with the first direction (e.g., the Z-axis direction). For example, the second magnetization 12M of the second magnetic layer 12 is substantially aligned with the first direction.

For example, the easy magnetization axis of the second magnetic layer 12 is aligned with the first direction (the Z-axis direction). For example, the absolute value of the angle between the Z-axis direction and the easy magnetization axis of the second magnetic layer 12 is 45 degrees or less.

Even in such a case, the third portion 20c of the conductive layer 20 includes the first region 21 and the second region 22. The first region 21 includes the first metal (at least one selected from the group consisting of Rh, Pd, and Ir). The second region 22 is provided between the first region 21 and the second magnetic layer 12. The second region 22 includes the first metal and boron. The first region 21 does not include boron. Or, in the case where the first region 21 includes boron, the first concentration of boron in the first region 21 is lower than the second concentration of boron in the second region 22. The second magnetic layer 12 has the first lattice length Lz12 along the first direction (the Z-axis direction) and the second lattice length Lx12 along the direction Dx perpendicular to the first direction (referring to FIG. 2A). The first lattice length Lz12 is longer than the second lattice length Lx12. In other words, the distortion of the crystal lattice is generated in the second magnetic layer 12.

In the magnetic memory device 130, the lattice is stable in the conductive layer 20 (the first region 21) because the first region 21 and the second region 22 recited above are provided. Thereby, the distortion of the lattice can be formed effectively in the second magnetic layer 12. By locally providing the second region 22 including B, a stable lattice can be maintained in the entire conductive layer 20. Also, the scattering efficiency of the electrons increases due to the local second region 22 including B. Thereby, a large spin Hall effect is obtained.

In the magnetic memory device 130 as well, a large voltage effect and a large spin Hall effect are obtained. Stable operations are possible.

For example, a direct switching mode operation is performed in the magnetic memory device 130. In the magnetic memory device 130, a high-speed magnetization reversal is obtained.

In the magnetic memory device 130, for example, the length along the second direction of the first magnetic layer 11 may be substantially the same as the length along the third direction of the first magnetic layer 11. In the magnetic memory device 130, a fine first stacked body SB1 (e.g., a MTJ element) is obtained easily. For example, a high storage density is obtained.

Figure 18:
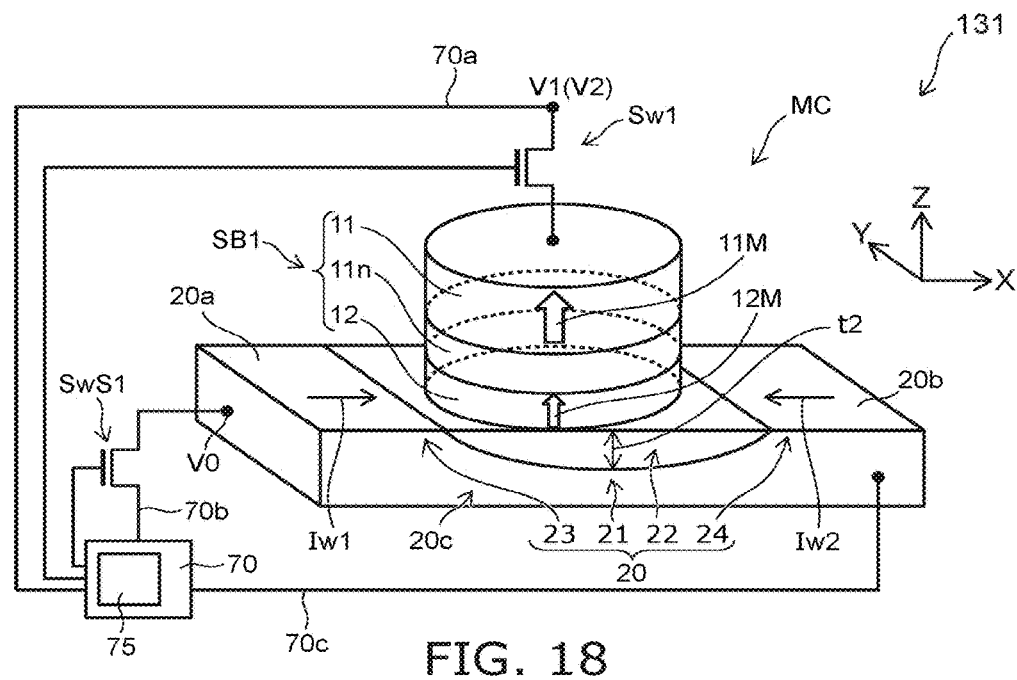
FIG. 18 is a schematic perspective view illustrating another magnetic memory device according to the second embodiment.

FIG. 18 is a schematic perspective view illustrating another magnetic memory device according to the second embodiment.

As shown in FIG. 18, the magnetic memory device 131 according to the embodiment also includes the conductive layer 20, the first magnetic layer 11, the second magnetic layer 12, the first nonmagnetic layer 11n, and the controller 70. In the magnetic memory device 131, the conductive layer 20 includes the first region 21, the second region 22, the third region 23, and the fourth region 24 described above. For example, the third region 23 and the fourth region 24 do not include boron. Or, the concentration of boron in the third region 23 and the concentration of boron in the fourth region 24 each are lower than the concentration (the second concentration) of boron in the second region 22. Otherwise, the configuration of the magnetic memory device 131 is similar to the configuration of the magnetic memory device 130. In the magnetic memory device 131 as well, a large voltage effect and a large spin Hall effect are obtained. Stable operations are possible.

Examples of the materials of the second embodiment will now be described.

The second magnetic layer 12 may include a perpendicular magnetic film. An example of the case where the second magnetic layer 12 is a perpendicular magnetic film is as follows. The second magnetic layer 12 includes Mn and at least one element. The at least one element includes at least one selected from the group consisting of Al, Ge, and Ga. The second magnetic layer 12 includes, for example, at least one selected from the group consisting of MnGa, MnAl, MnGe, and MnAlGe. For example, the second magnetic layer 12 includes Mn, Ga, and at least one element. The at least one element includes at least one selected from the group consisting of Al, Ge, Ir, Cr, Co, Pt, Ru, Pd, Rh, Ni, Fe, Re, Au, Cu, B, C, P, Gd, Tb, and Dy. The second magnetic layer 12 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the case where the second magnetic layer 12 includes a perpendicular magnetic film, the second magnetic layer 12 may include, for example, an alloy. The alloy includes one element and another one element. The one element includes, for example, at least one selected from the group consisting of Fe, Co, and Ni. The other one element includes, for example, at least one selected from the group consisting of Ru, Rh, Pd, Ag, Ir, Pt, and Au. The alloy recited above may include, for example, at least one selected from the group consisting of FeRh, FePt, FePd, CoPt, and CoPd. These alloys are, for example, ferromagnetic alloys.

The first magnetic layer 11 may include, for example, a perpendicular magnetic film. In the case where the first magnetic layer 11 includes a perpendicular magnetic film, for example, the first magnetic layer 11 includes Mn and at least one element. The at least one element includes at least one selected from Al, Ge, and Ga. The first magnetic layer 11 includes, for example, at least one selected from the group consisting of MnGa, MnAl, MnGe, and MnAlGe. For example, the first magnetic layer 11 includes Mn, Ga, and at least one element. The at least one element includes at least one selected from the group consisting of Al, Ge, Ir, Cr, Co, Pt, Ru, Pd, Rh, Ni, Fe, Re, Au, Cu, B, C, P, Gd, Tb, and Dy. The first magnetic layer 11 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the case where the first magnetic layer 11 includes a perpendicular magnetic film, the first magnetic layer 11 may include, for example, an alloy. The crystal of at least a portion of the alloy has, for example, a (111) face-centered cubic structure (FCC) orientation. Or, the crystal of at least a portion of the alloy has a (0001) hexagonal close-packed structure (HCP) orientation. The alloy that is included in the first magnetic layer 11 may form, for example, an artificial lattice. For example, the alloy recited above that has the (111) FCC or (0001) HCP crystal orientation includes, for example, one element and another one element. The one element includes at least one selected from the group consisting of Fe, Co, Ni, and Cu. The other one element includes at least one selected from the group consisting of Pt, Pd, Rh, and Au. The alloy that is included in the first magnetic layer 11 is, for example, a ferromagnetic alloy. The ferromagnetic alloy includes, for example, at least one selected from the group consisting of CoPd, CoPt, NiCo, and NiPt.

The alloy recited above that is included in the first magnetic layer 11 and may form the artificial lattice includes, for example, a first layer and a second layer that are stacked alternately. The first layer includes, for example, an alloy (a ferromagnetic film) including one element selected from the group consisting of Fe, Co, and Ni. The second layer includes, for example, an alloy (a nonmagnetic film) including one element selected from the group consisting of Cr, Pt, Pd, Ir, Rh, Ru, Os, Re, Au, and Cu. The first magnetic layer 11 includes, for example, at least one selected from the group consisting of a Co/Pt artificial lattice, a Co/Pd artificial lattice, a CoCr/Pt artificial lattice, a Co/Ru artificial lattice, a Co/Ir artificial lattice, a Co/Os artificial lattice, a Co/Au artificial lattice, and a Ni/Cu artificial lattice. In these artificial lattices, at least one of the addition of an element to the ferromagnetic film or the ratio of the thicknesses of the ferromagnetic film and the nonmagnetic film is adjusted. At least one of the perpendicular magnetic anisotropy or the saturation magnetization can be adjusted.

The first magnetic layer 11 may include an alloy. The alloy includes one element and another one element. The one element includes at least one selected from the group consisting of Fe, Co, and Ni. The one element is, for example, a transition metal. The other one element includes, for example, at least one selected from the group consisting of Tb, Dy, and Gd. The other one element is, for example, a rare-earth metal. The first magnetic layer 11 includes, for example, at least one selected from the group consisting of TbFe, TbCo, TbFeCo, DyFeCo, GdFeCo, DyTbFeCo, and GdTbCo. The first magnetic layer 11 may include a stacked body. The stacked body includes multiple layers. Each of the multiple layers includes the alloy recited above. Multiple types of layers may be stacked alternately in the stacked body. The first magnetic layer 11 may include, for example, the at least one stacked body selected from the group consisting of TbFe/Co, TbCo/Fe, TbFeCo/CoFe, DyFe/Co, DyCo/Fe, and DyFeCo/CoFe. For example, at least one of the thickness or the composition is adjusted for these alloys. For example, at least one of the perpendicular magnetic anisotropy or the saturation magnetization is adjusted.

The first magnetic layer 11 may include an alloy. The alloy includes one element and another one element. The one element includes at least one selected from the group consisting of Fe, Co, Ni, and Cu. The other one element includes at least one selected from the group consisting of Pt, Pd, Rh, and Au. The first magnetic layer 11 includes, for example, a ferromagnetic alloy. The ferromagnetic alloy includes at least one selected from the group consisting of FeRh, FePt, FePd, CoPt, and CoPd.

The material of the first nonmagnetic layer 11n of the second embodiment is similar to the material of the first nonmagnetic layer 11n of the first embodiment.

Third Embodiment

FIG. 19 is a schematic cross section illustrating a magnetic memory device according to a third embodiment.

As shown in FIG. 19, the magnetic memory device 141 according to the embodiment includes a third magnetic layer 13, a fourth magnetic layer 14, and a second nonmagnetic layer 12n in addition to the conductive layer 20, the first magnetic layer 11, the second magnetic layer 12, and the first nonmagnetic layer 11n. The magnetic memory device 141 also includes the controller 70 (referring to FIG. 1A). The controller 70 is not illustrated in FIG. 19.

The first magnetic layer 11, the second magnetic layer 12, and the first nonmagnetic layer 11n are included in the first stacked body SB1. The third magnetic layer 13, the fourth magnetic layer 14, and the second nonmagnetic layer 12n are included in a second stacked body SB2. In the example, the first stacked body SB1 further includes a first conductive member E1. The second stacked body SB2 further includes a second conductive member E2.

The conductive layer 20 further includes a fourth portion 20d and a fifth portion 20e in addition to the first to third portions 20a to 20c. In the second direction (the X-axis direction), the third portion 20c is positioned between the first portion 20a and the second portion 20b. The fourth portion 20d is provided between the third portion 20c and the second portion 20b in the second direction. The fifth portion 20e is provided between the fourth portion 20d and the second portion 20b in the second direction.

In the first direction (the Z-axis direction), the first magnetic layer 11 is provided between the first conductive member E1 and the third portion 20c. The second magnetic layer 12 is provided between the first magnetic layer 11 and the third portion 20c. The first nonmagnetic layer 11n is provided between the first magnetic layer 11 and the second magnetic layer 12.

In the first direction (the Z-axis direction), the third magnetic layer 13 is provided between the second conductive member E2 and the fifth portion 20e. The fourth magnetic layer 14 is provided between the third magnetic layer 13 and the fifth portion 20e. The second nonmagnetic layer 12n is provided between the third magnetic layer 13 and the fourth magnetic layer 14.

The first stacked body SB1 and the second stacked body SB2 each are memory cells MC.

As described above, the conductive layer 20 includes the first region 21 and the second region 22. The second region 22 is provided between the first region 21 and the second magnetic layer 12. For example, the second region 22 physically contacts the second magnetic layer 12. The second region 22 includes the first metal and boron. The conductive layer 20 further includes another first region 21A and another second region 22A. The other second region 22A is provided between the other first region 21A and the fourth magnetic layer 14. For example, the other second region 22A physically contacts the fourth magnetic layer 14. The other second region 22A includes the first metal and boron.

A first insulating region 51 is further provided in the magnetic memory device 141. For example, at least a portion of the first insulating region 51 is positioned between the second region 22 and the other second region 22A in the second direction (the X-axis direction). The first insulating region 51 includes, for example, an element included in the second region 22 and the other second region 22A. The first insulating region 51 includes, for example, at least one of an oxide including the element included in the second region 22 and the other second region 22A or a nitride including the element. For example, a material that has insulative properties is formed from a film including the materials used to form the second region 22 and the other second region 22A. The first insulating region 51 includes this material. Good insulative properties are obtained. Stable characteristics are obtained.

For example, at least a portion of the first insulating region 51 may be formed by the reaction (e.g., at least one of oxidization or nitridation) of at least a portion of the film used to form the second region 22 and the other second region 22A. At least a portion of the first insulating region 51 may include an unreacted portion of the film used to form the second region 22 and the other second region 22A.

FIG. 20 is a schematic cross section illustrating another magnetic memory device according to the third embodiment.

As shown in FIG. 20, a second insulating region 52 is further provided in the magnetic memory device 142 according to the embodiment. Otherwise, the configuration of the magnetic memory device 142 is the same as the configuration of the magnetic memory device 141.

For example, at least a portion of the second insulating region 52 is positioned between the second magnetic layer 12 and the fourth magnetic layer 14 in the second direction (the X-axis direction). The second insulating region 52 includes, for example, an element included in the second magnetic layer 12 and the fourth magnetic layer 14. The second insulating region 52 includes, for example, at least one of an oxide including the element included in the second magnetic layer 12 and the fourth magnetic layer 14 or a nitride including the element. For example, a material that has insulative properties is formed from a film including the materials used to form the second magnetic layer 12 and the fourth magnetic layer 14. The second insulating region 52 includes this material. Good insulative properties are obtained. Stable characteristics are obtained.

For example, at least a portion of the second insulating region 52 may be formed by a reaction (e.g., at least one of oxidization or nitridation) of at least a portion of the film used to form the second magnetic layer 12 and the fourth magnetic layer 14. At least a portion of the second insulating region 52 may include an unreacted portion of the film used to form the second magnetic layer 12 and the fourth magnetic layer 14.

FIG. 21 is a schematic cross section illustrating another magnetic memory device according to the third embodiment.

As shown in FIG. 21, a third insulating region 53 is further provided in the magnetic memory device 143 according to the embodiment. Otherwise, the configuration of the magnetic memory device 143 is the same as the configuration of the magnetic memory device 142.

For example, at least a portion of the third insulating region 53 is positioned between the first nonmagnetic layer 11n and the second nonmagnetic layer 12n in the second direction (the X-axis direction). The third insulating region 53 includes, for example, an element included in the first nonmagnetic layer 11n and the second nonmagnetic layer 12n. The third insulating region 53 includes, for example, at least one of an oxide including the element included in the first nonmagnetic layer 11n and the second nonmagnetic layer 12n or a nitride including the element. For example, a material that has insulative properties is formed from the film including the materials used to form the first nonmagnetic layer 11n and the second nonmagnetic layer 12n. The third insulating region 53 includes this material. Good insulative properties are obtained. Stable characteristics are obtained.

For example, at least a portion of the third insulating region 53 may be formed by a reaction (e.g., at least one of oxidization or nitridation) of at least a portion of the film used to form the first nonmagnetic layer 11n and the second nonmagnetic layer 12n. At least a portion of the third insulating region 53 may include an unreacted portion of the film used to form the first nonmagnetic layer 11n and the second nonmagnetic layer 12n.

At least one of the first to third insulating regions 51 to 53 is applicable to any magnetic memory device according to the first and second embodiments.

Fourth Embodiment

Figure 22:
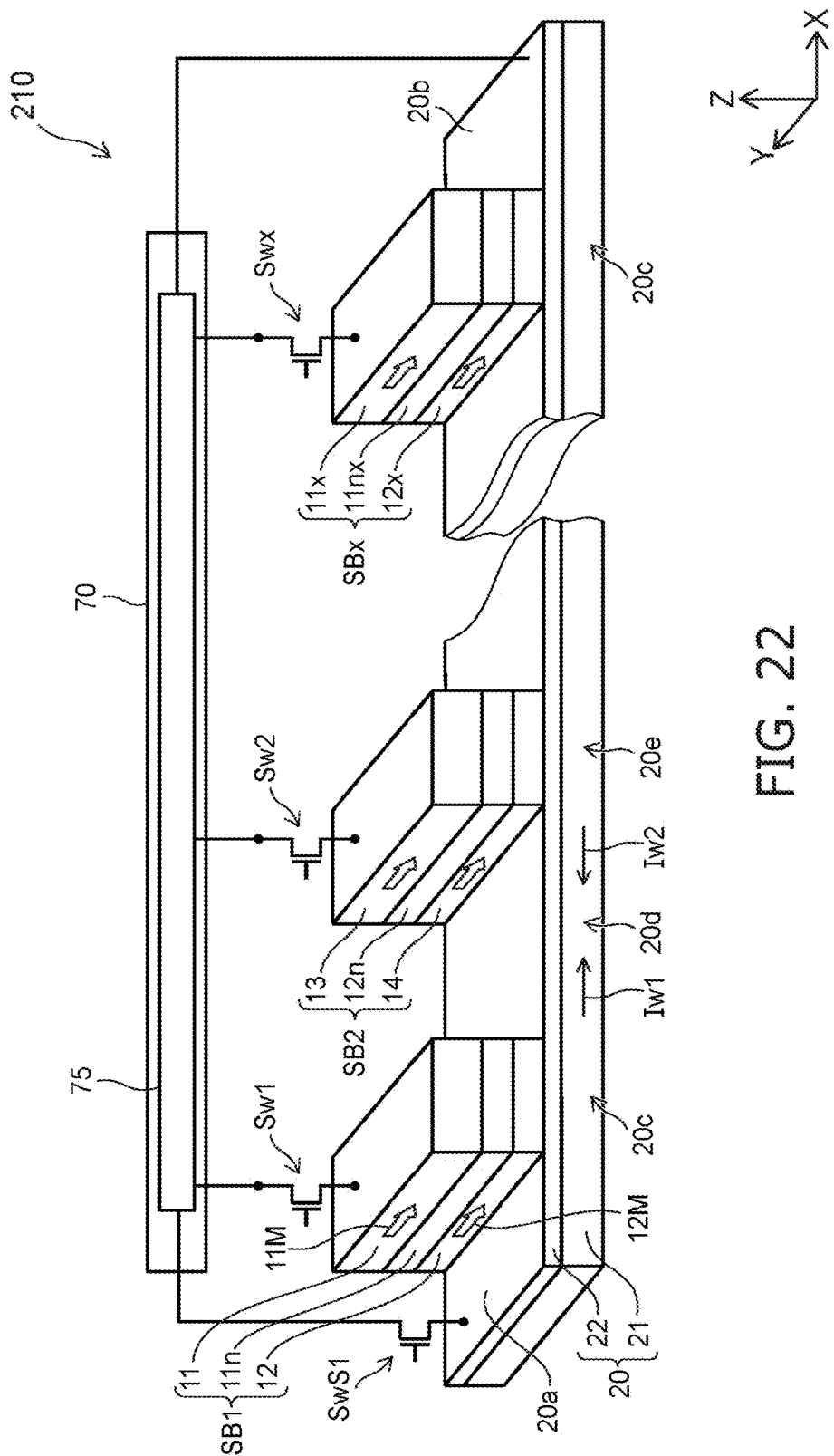
FIG. 22 is a schematic perspective view illustrating a magnetic memory device according to a fourth embodiment.

FIG. 22 is a schematic perspective view illustrating a magnetic memory device according to a fourth embodiment.

As shown in FIG. 22, multiple stacked bodies (the first stacked body SB1, the second stacked body SB2, a stacked body SBx, etc.) are provided in the magnetic memory device 210 according to the embodiment. Multiple switches (the switch Sw1, the switch Sw2, the switch Swx, etc.) also are provided. Otherwise, the configuration of the magnetic memory device 210 is similar to that of the magnetic memory device 110.

The conductive layer 20 further includes the fourth portion 20d and the fifth portion 20e in addition to the first to third portions 20a to 20c. As described above, the third portion 20c is positioned between the first portion 20a and the second portion 20b in the second direction (the X-axis direction). The fourth portion 20d is provided between the third portion 20c and the second portion 20b in the second direction. The fifth portion 20e is provided between the fourth portion 20d and the second portion 20b in the second direction.

The multiple stacked bodies are arranged along the conductive layer 20. The first stacked body SB1 overlaps the third portion 20c in the first direction (the Z-axis direction). The second stacked body SB2 overlaps the fifth portion 20e in the first direction. The direction from the first stacked body SB1 toward the second stacked body SB2 is aligned with the second direction.

For example, the second stacked body SB2 includes the third magnetic layer 13, the fourth magnetic layer 14, and the second nonmagnetic layer 12n. The third magnetic layer 13 is separated from a portion (the fifth portion 20e) of the conductive layer 20 in the first direction (the Z-axis direction). The fourth magnetic layer 14 is provided between the third magnetic layer 13 and the portion (the fifth portion 20e) of the conductive layer 20. The second nonmagnetic layer 12n is provided between the third magnetic layer 13 and the fourth magnetic layer 14.

For example, the third magnetic layer 13 is separated from the first magnetic layer 11 in the second direction (e.g., the X-axis direction). The fourth magnetic layer 14 is separated from the second magnetic layer 12 in the second direction. The second nonmagnetic layer 12n is separated from the first nonmagnetic layer 11n in the second direction.

For example, the stacked body SBx includes a magnetic layer 11x, a magnetic layer 12x, and a nonmagnetic layer 11nx. The magnetic layer 11x is separated from another portion of the conductive layer 20 in the first direction (the Z-axis direction). The magnetic layer 12x is provided between the magnetic layer 11x and the other portion of the conductive layer 20. The nonmagnetic layer 11nx is provided between the magnetic layer 11x and the magnetic layer 12x.

For example, the material and the configuration of the third magnetic layer 13 are the same as the material and the configuration of the first magnetic layer 11. For example, the material and the configuration of the fourth magnetic layer 14 are the same as the material and the configuration of the second magnetic layer 12. For example, the material and the configuration of the second nonmagnetic layer 12n are the same as the material and the configuration of the first nonmagnetic layer 11n.

The multiple stacked bodies function as multiple memory cells MC.

The second region 22 of the conductive layer 20 is provided also between the fourth magnetic layer 14 and the first region 21. The second region 22 of the conductive layer 20 is provided also between the magnetic layer 12x and the first region 21.

The switch Sw1 is electrically connected to the first magnetic layer 11. The switch Sw2 is electrically connected to the third magnetic layer 13. The switch Swx is electrically connected to the magnetic layer 11x. These switches are electrically connected to the control circuit 75 of the controller 70. Any of the multiple stacked bodies are selected by these switches.

In the example of the magnetic memory device 210, the second region 22 extends along the second direction (e.g., the X-axis direction). The second region 22 is provided also in a region corresponding to the region between the multiple stacked bodies.

Figure 23:
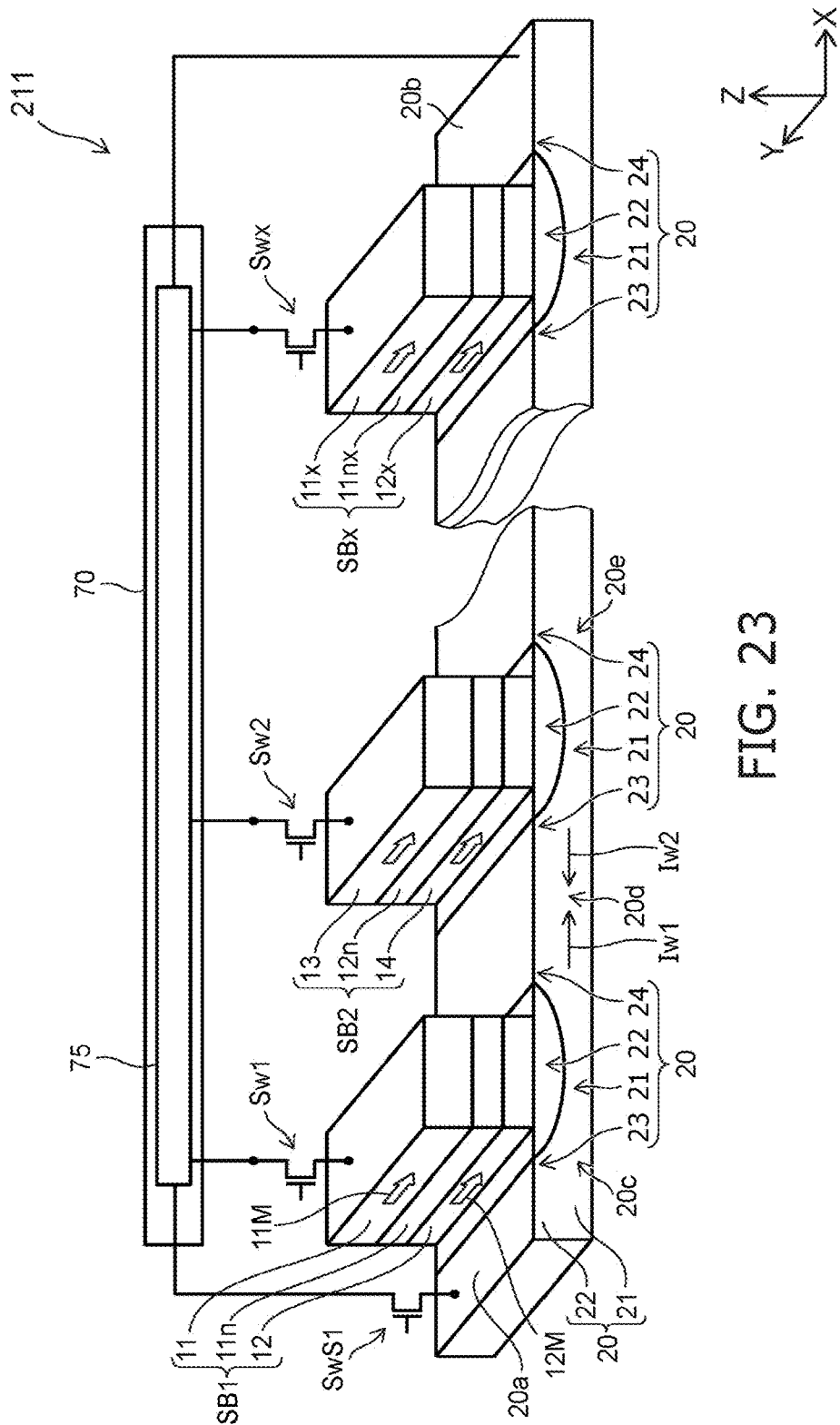
FIG. 23 is a schematic perspective view illustrating another magnetic memory device according to the fourth embodiment.

FIG. 23 is a schematic perspective view illustrating another magnetic memory device according to the fourth embodiment.

As shown in FIG. 23, multiple stacked bodies and multiple switches are provided in the magnetic memory device 211 according to the embodiment as well. Otherwise, the configuration of the magnetic memory device 211 is similar to that of the magnetic memory device 111.

In the magnetic memory device 211, the second region 22 that includes boron is provided locally between the first region 21 and each of the multiple stacked bodies.

Fifth Embodiment

Figure 24A:
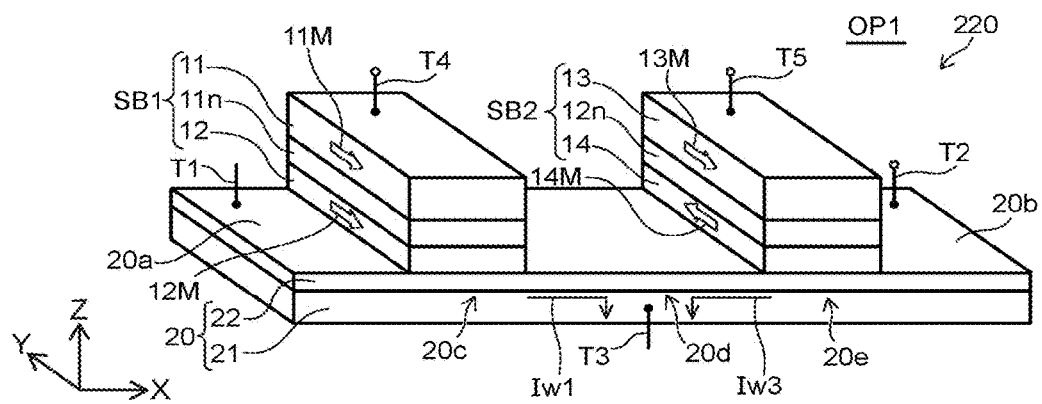
FIG. 24A to FIG. 24C are schematic perspective views illustrating a magnetic memory device according to a fifth embodiment.
Figure 24B:
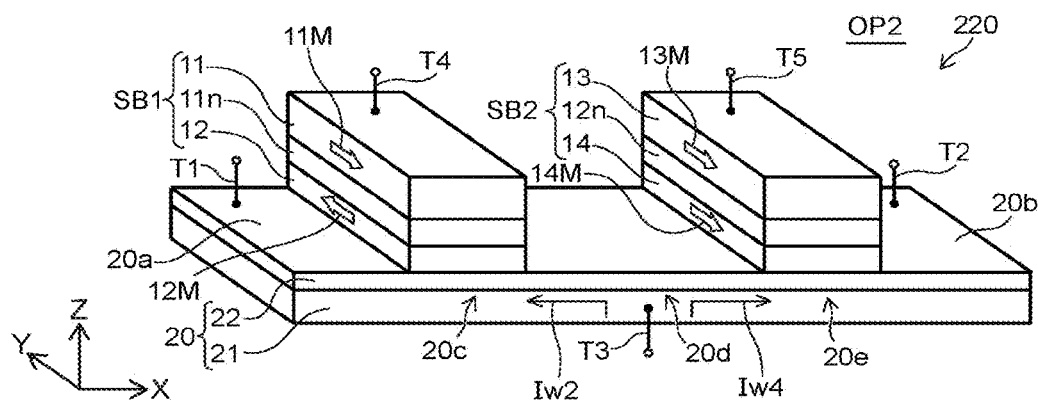
Figure 24C:
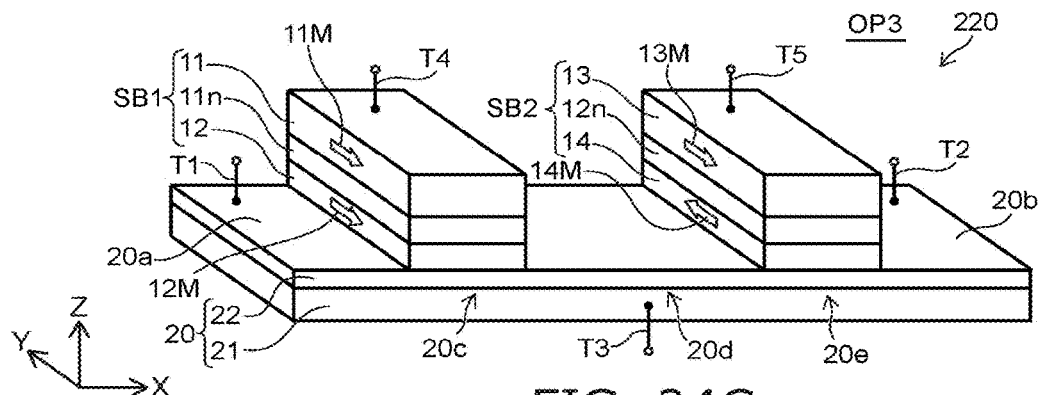

FIG. 24A to FIG. 24C are schematic perspective views illustrating a magnetic memory device according to a fifth embodiment.

As shown in FIG. 24A, multiple stacked bodies (the first stacked body SB1 and the second stacked body SB2) are provided in the magnetic memory device 220 according to the embodiment as well. In the magnetic memory device 220, the current that flows in the first stacked body SB1 is different from the current that flows in the second stacked body SB2.

The first stacked body SB1 overlaps the third portion 20c in the first direction (the Z-axis direction). The second stacked body SB2 overlaps the fifth portion 20e in the first direction. The fourth portion 20d of the conductive layer 20 corresponds to a portion between the first stacked body SB1 and the second stacked body SB2.

For example, a first terminal T1 is electrically connected to the first portion 20a of the conductive layer 20. A second terminal T2 is electrically connected to the second portion 20b. A third terminal T3 is electrically connected to the fourth portion 20d. A fourth terminal T4 is electrically connected to the first magnetic layer 11. A fifth terminal T5 is electrically connected to the third magnetic layer 13.

In one operation OP1 as shown in FIG. 24A, the first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation OP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation OP2 shown in FIG. 24B, the second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation OP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 24A and FIG. 24B, the orientation of a fourth magnetization 14M of the fourth magnetic layer 14 is the reverse of the orientation of the second magnetization 12M of the second magnetic layer 12. On the other hand, the orientation of a third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation OP1 corresponds to "1." For example, the information (the data) in the case of the operation OP2 corresponds to "0." By such operations, for example, the reading can be faster as described below.

In the operation OP1 and the operation OP2, the second magnetization 12M of the second magnetic layer 12 and the spin current of the electrons (the polarized electrons) flowing through the conductive layer 20 have an interaction. The orientation of the second magnetization 12M and the orientation of the spin of the polarized electrons have a parallel or an antiparallel relationship. The second magnetization 12M of the second magnetic layer 12 precesses and reverses. In the operation OP1 and the operation OP2, the orientation of the fourth magnetization 14M of the fourth magnetic layer 14 and the orientation of the spin of the polarized electrons have a parallel or an antiparallel relationship. The fourth magnetization 14M of the fourth magnetic layer 14 precesses and reverses.

FIG. 24C illustrates a read operation of the magnetic memory device 220.

In the read operation OP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as ΔV. Two electrical resistances of each of the multiple stacked bodies are taken as a high resistance Rh and a low resistance Rl. The high resistance Rh is higher than the low resistance Rl. For example, the resistance corresponds to the high resistance Rh when the first magnetization 11M and the second magnetization 12M are antiparallel. For example, the resistance corresponds to the low resistance Rl when the first magnetization 11M and the second magnetization 12M are parallel. For example, the resistance corresponds to the high resistance Rh when the third magnetization 13M and the fourth magnetization 14M are antiparallel. For example, the resistance corresponds to the low resistance Rl when the third magnetization 13M and the fourth magnetization 14M are parallel.

For example, in the operation OP1 (the "1" state) illustrated in FIG. 24A, a potential Vr1 of the third terminal T3 is represented by Formula (1).

$$Vr1 = (Rl/(Rl+Rh)) \times \Delta V \quad (1)$$

On the other hand, a potential Vr2 of the third terminal T3 in the state of the operation OP2 (the "0" state) illustrated in FIG. 24B is represented by Formula (2).

$$Vr2 = (Rh/(Rl+Rh)) \times \Delta V \quad (2)$$

Accordingly, a potential change ΔVr between the "1" state and the "0" state is represented by Formula (3).

$$\Delta Vr = Vr2 - Vr1 = ((Rh-Rl)/(Rl+Rh)) \times \Delta V \quad (3)$$

The potential change ΔVr is obtained by measuring the potential of the third terminal T3.

For example, the consumed energy when reading in the read operation OP3 recited above can be reduced compared to the case where a constant current is supplied to the stacked body (the magnetoresistive element) and the voltage (the potential difference) is measured between the two magnetic layers of the magnetoresistive element. In the read operation OP3 recited above, for example, high-speed reading can be performed.

In the operation OP1 and the operation OP2 recited above, the perpendicular magnetic anisotropies of the second magnetic layer 12 and the fourth magnetic layer 14 can be controlled by using the fourth terminal T4 and the fifth terminal T5. Thereby, the write current can be reduced. For example, the write current can be about ½ of the case where the writing is performed without using the fourth terminal T4 and the fifth terminal T5. For example, the write charge can be reduced. The relationship between the increase and decrease of the perpendicular magnetic anisotropy and the polarity of the voltage applied to the fourth terminal T4 and the fifth terminal T5 is dependent on the materials of the magnetic layers and the conductive layer 20.

Sixth Embodiment

Figure 25:
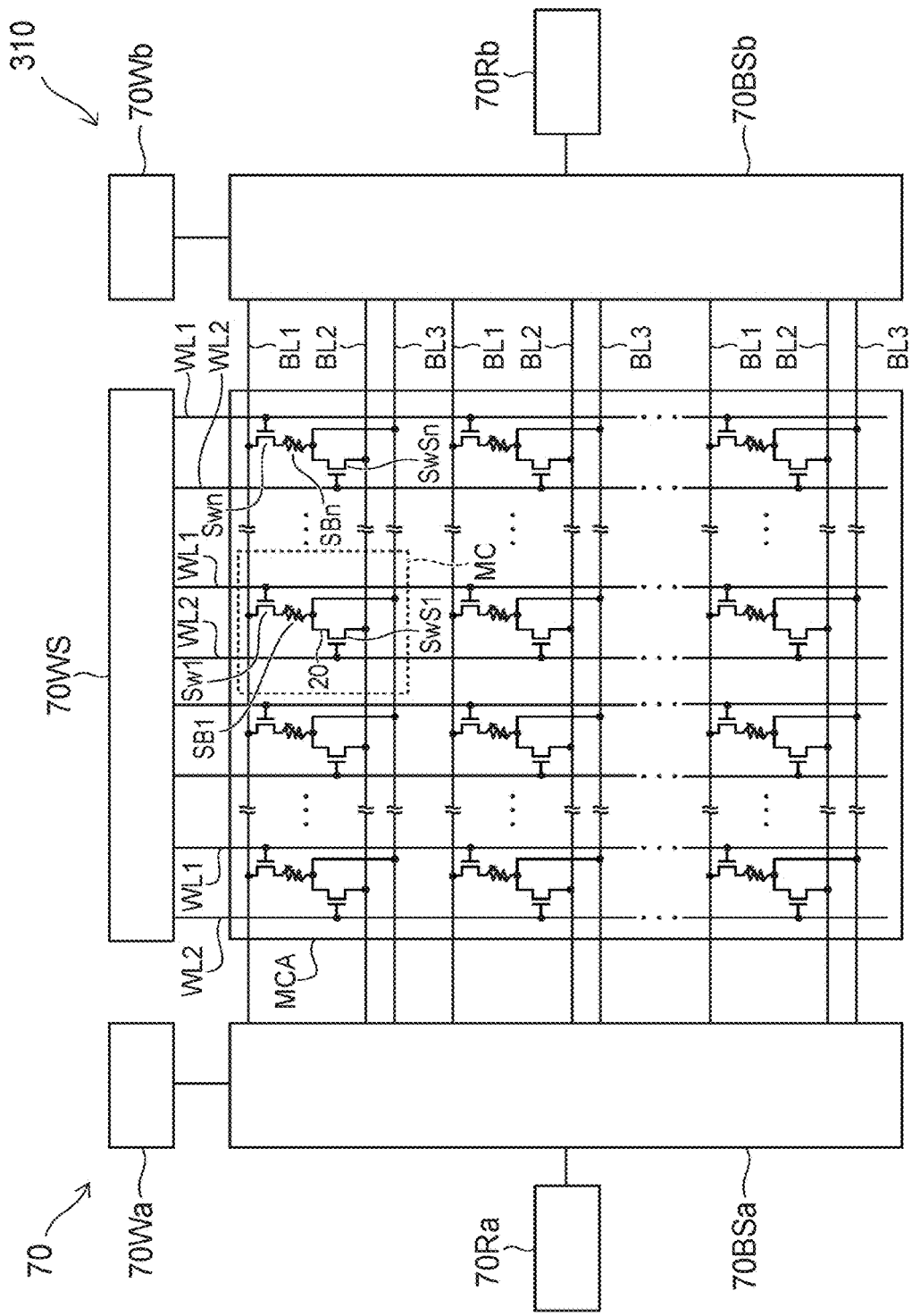
FIG. 25 is a schematic view showing a magnetic memory device according to a sixth embodiment.

FIG. 25 is a schematic view showing a magnetic memory device according to a sixth embodiment.

As shown in FIG. 25, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first write circuit 70Wa, a second write circuit 70Wb, a first read circuit 70Ra, and a second read circuit 70Rb. The multiple memory cells MC are arranged in an array configuration in the memory cell array MCA.

For example, the switch Sw1 and the switch SwS1 are provided to correspond to one of the multiple memory cells MC. These switches are considered to be included in the one of the multiple memory cells. These switches may be considered to be included in the controller 70. These switches are, for example, transistors. The one of the multiple memory cells MC includes, for example, a stacked body (e.g., the first stacked body SB1).

As described in reference to FIG. 22 to FIG. 24C, multiple stacked bodies (the first stacked body SB1, the second stacked body SB2, the stacked body SBx, etc.) may be provided for one conductive layer 20. Multiple switches (the switch Sw1, the switch Sw2, the switch Swx, etc.) may be provided respectively for the multiple stacked bodies. In FIG. 25, one stacked body (the stacked body SB1 or the like) and one switch (the switch Sw1 or the like) are drawn to correspond to one conductive layer 20 for easier viewing of the drawing.

As shown in FIG. 25, one end of the first stacked body SB1 is connected to the conductive layer 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive layer 20 is connected to one of the source or the drain of the switch SwS1. The other end (e.g., the second portion 20b) of the conductive layer 20 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the write operation of information to the memory cell MC will now be described.

The switch SwS1 of one memory cell MC (the selected memory cell) to which the writing is to be performed is set to the ON state. For example, in the ON state, the word line WL2 that is connected to the gate of one switch SwS1 is set to a high-level potential. The setting of the potential is performed by the word line selection circuit 70WS. The switch SwS1 of another memory cell MC (an unselected memory cell) of the column including the one memory cell MC (the selected memory cell) recited above also is set to the ON state. In one example, the word line WL1 that is connected to the gate of the switch Sw1 inside the memory cell MC (the selected memory cell) and the word lines WL1 and WL2 that correspond to the other columns are set to a low-level potential.

Although one switch Sw1 and one stacked body that correspond to one conductive layer 20 are drawn in FIG. 25, the multiple switches (the switch Sw1, the switch Sw2, the switch Swx, etc.) and the multiple stacked bodies (the stacked body SB1, the second stacked body SB2, the stacked body SBx, etc.) that correspond to one conductive layer 20 are provided as described above. In such a case, for example, the switches that are connected respectively to the multiple stacked bodies are set to the ON state. The select voltage is applied to one of the multiple stacked bodies. On the other hand, the unselect voltage is applied to the other stacked bodies. Writing is performed to the one of the multiple stacked bodies recited above; and the writing is not performed to the other stacked bodies. Selective writing of the multiple stacked bodies is performed.

The bit lines BL2 and BL3 that are connected to the memory cell MC (the selected cell) to which the writing is to be performed are selected. The selection is performed by the first bit line selection circuit 70BSa and the second bit line selection circuit 70BSb. A write current is supplied to the selected bit lines BL2 and BL3. The supply of the write current is performed by the first write circuit 70Wa and the second write circuit 70Wb. The write current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12, etc.) of the MTJ element (the first stacked body SB1, etc.) is changeable by the write current. The magnetization direction of the memory layer of the MTJ element is changeable to the reverse direction of that recited above when the write current flows from the other of the first bit line selection circuit 70BSa or the second bit line selection circuit 70BSb toward the one of the first bit line selection circuit 70BSa or the second bit line selection circuit 70BSb. Thus, the writing is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON state. At this time, the switches Sw1 of the other memory cells MC (the unselected cells) of the column including the memory cell MC (the selected cell) recited above also are set to the ON state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the bit line BL1 and the bit line BL3 that are selected. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is sensed by the first read circuit 70Ra and the second read circuit 70Rb. For example, the difference between the magnetization of a reference layer (the first magnetic layer 11) and the magnetization of a memory layer (the second magnetic layer 12) of the MTJ element is sensed. The difference includes the orientations of the magnetizations being in a mutually-parallel state (having the same orientation) or a mutually-antiparallel state (having the reverse orientation). Thus, the read operation is performed.

According to the embodiment, a magnetic memory device can be provided in which the write current can be reduced.

In this specification, the notation of "first material/second material" means that the first material is positioned on the second material. For example, a layer of the first material is formed on a layer of the second material.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to examples. However, the invention is not limited to these examples. For example, one skilled in the art may similarly practice the invention by appropriately selecting specific configurations of components included in the magnetic memory device such as the magnetic layer, the nonmagnetic layer, the conductive layer, the controller, etc., from known art; and such practice is within the scope of the invention to the extent that similar effects can be obtained.

Any two or more components of the examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a conductive layer including a first portion, a second portion, and a third portion positioned between the first portion and the second portion, the conductive layer including a first metal;
   a first magnetic layer separated from the third portion in a first direction crossing a second direction, the second direction being from the first portion toward the second portion;
   a second magnetic layer provided between the third portion and the first magnetic layer;
   a first nonmagnetic layer provided between the first magnetic layer and the second magnetic layer; and
   a controller electrically connected to the first portion and the second portion, the second magnetic layer having a first lattice length and a second lattice length, the first lattice length being along the first direction, the second lattice length being along a direction perpendicular to the first direction, the first lattice length being longer than the second lattice length, the controller implementing
- a first operation of supplying a first current to the conductive layer from the first portion toward the second portion, and
- a second operation of supplying a second current to the conductive layer from the second portion toward the first portion.

2. The device according to claim 1, wherein an easy magnetization axis of the second magnetic layer crosses the first direction.

3. The device according to claim 1, wherein
the third portion includes a first region and a second region, the first region including the first metal, the second region including the first metal and boron and being provided between the first region and the second magnetic layer, and
the first region does not include boron, or a first concentration of boron in the first region is lower than a second concentration of boron in the second region.

4. The device according to claim 3, wherein
the conductive layer further includes a third region and a fourth region,
the second region is positioned between the third region and the fourth region in the second direction, and
the third region and the fourth region do not include boron, or a concentration of boron in the third region and a concentration of boron in the fourth region each are lower than the second concentration.

5. The device according to claim 3, wherein
the conductive layer further includes a third region and a fourth region,
the second region is positioned between the third region and the fourth region in the second direction, and
a concentration of boron in the third region and a concentration of boron in the fourth region each are higher than the first concentration.

6. The device according to claim 5, wherein a thickness of the second region along the first direction is thicker than a thickness of the third region along the first direction and thicker than a thickness of the fourth region along the first direction.

7. The device according to claim 3, wherein
the second magnetic layer includes boron, and
a concentration of boron in the second magnetic layer is higher than the second concentration.

8. The device according to claim 1, wherein the first metal includes at least one selected from the group consisting of Rh, Pd, and Ir.

9. The device according to claim 1, wherein the second magnetic layer has a BCT (body-centered tetragonal) structure.

10. The device according to claim 1, wherein a <001> direction of the conductive layer is aligned with the first direction.

11. The device according to claim 1, wherein
the controller is further electrically connected to the first magnetic layer,
the controller further implements a third operation and a fourth operation,
in the first operation, the controller sets a potential difference between the first portion and the first magnetic layer to a first voltage,
in the second operation, the controller sets the potential difference between the first portion and the first magnetic layer to the first voltage,
in the third operation, the controller sets the potential difference between the first portion and the first magnetic layer to a second voltage and supplies the first current to the conductive layer,
in the fourth operation, the controller sets the potential difference between the first portion and the first magnetic layer to the second voltage and supplies the second current to the conductive layer,
the first voltage is different from the second voltage,
a first electrical resistance between the first magnetic layer and the first portion after the first operation is different from a second electrical resistance between the first magnetic layer and the first portion after the second operation, and
the absolute value of a difference between the first electrical resistance and the second electrical resistance is greater than the absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.

12. The device according to claim 1, wherein a thickness along the first direction of the conductive layer is not less than 2 nanometers and not more than 11 nanometers.

13. The device according to claim 1, wherein a thickness along the first direction of the second magnetic layer is not less than 0.5 nanometers and not more than 3 nanometers.

14. The device according to claim 1, further comprising:
a third magnetic layer;
a fourth magnetic layer; and
a second nonmagnetic layer,
the conductive layer further including a fourth portion and a fifth portion, the fourth portion being provided between the third portion and the second portion, the fifth portion being provided between the fourth portion and the second portion,
the third magnetic layer being separated from the fifth portion in the first direction;
the fourth magnetic layer being provided between the fifth portion and the third magnetic layer;
the second nonmagnetic layer being provided between the third magnetic layer and the fourth magnetic layer,
wherein
the controller supplies the first current to the conductive layer from the first portion toward the fourth portion in the first operation and a third current to the conductive layer from the second portion toward the fourth portion in the first operation, and
the controller supplies the second current to the conductive layer from the fourth portion toward the first portion and a forth current to the conductive layer from the fourth portion toward the second portion in the second operation.

15. The device according to claim 1, wherein
the second magnetic layer includes Co and Fe, and
a composition ratio of Co in the second magnetic layer is 0.6 or less.

16. The device according to claim 1, wherein the second magnetic layer includes a first element and boron, and the first element includes at least one selected from the group consisting of Co, Fe, and Ni.

17. The device according to claim 1, further comprising an insulating region,
- a direction from the second magnetic layer toward the insulating region is along the second direction,
- a direction from the second portion toward the insulating region is along the first direction,
- the insulating region includes the first element and a second element, and
- the second element includes at least one selected from the group consisting oxygen and nitrogen.

18. The device according to claim 1, wherein the second magnetic layer includes a region having a BCT (body-centered tetragonal) structure, and a region having a FCT (face-centered tetragonal) structure.

19. A magnetic memory device, comprising:
- a conductive layer including a first portion, a second portion, and a third portion positioned between the first portion and the second portion;
- a first magnetic layer separated from the third portion in a first direction crossing a second direction, the second direction being from the first portion toward the second portion;
- a second magnetic layer provided between the third portion and the first magnetic layer;
- a first nonmagnetic layer provided between the first magnetic layer and the second magnetic layer; and
- a controller electrically connected to the first portion and the second portion,
- the third portion including a first region and a second region, the first region including a first metal, the second region including the first metal and boron and being provided between the first region and the second magnetic layer,
- the first region not including boron, or a first concentration of boron in the first region being lower than a second concentration of boron in the second region,
- the second magnetic layer having a first lattice length and a second lattice length, the first lattice length being along the first direction, the second lattice length being along a direction perpendicular to the first direction, the first lattice length being longer than the second lattice length,
- the controller implementing
  - a first operation of supplying a first current to the conductive layer from the first portion toward the second portion, and
  - a second operation of supplying a second current to the conductive layer from the second portion toward the first portion.

20. The device according to claim 19, further comprising:
- a third magnetic layer;
- a fourth magnetic layer; and
- a second nonmagnetic layer,
- the conductive layer further including a fourth portion and a fifth portion, the fourth portion being provided between the third portion and the second portion, the fifth portion being provided between the fourth portion and the second portion,
- the third magnetic layer being separated from the fifth portion in the first direction;
- the fourth magnetic layer being provided between the fifth portion and the third magnetic layer;
- the second nonmagnetic layer being provided between the third magnetic layer and the fourth magnetic layer,
wherein
- the controller supplies the first current to the conductive layer from the first portion toward the fourth portion in the first operation and a third current to the conductive layer from the second portion toward the fourth portion in the first operation, and
- the controller supplies the second current to the conductive layer from the fourth portion toward the first portion and a forth current to the conductive layer from the fourth portion toward the second portion in the second operation.

* * * * *